(12) United States Patent
Ooi et al.

(10) Patent No.: US 10,980,108 B2
(45) Date of Patent: Apr. 13, 2021

(54) MULTI-CONDUCTOR INTERCONNECT STRUCTURE FOR A MICROELECTRONIC DEVICE

(71) Applicant: Intel Corporation, Santa Clara, CA (US)

(72) Inventors: Ping Ping Ooi, Butterworth (MY); Bok Eng Cheah, Bukit Gambir (MY); Jackson Chung Peng Kong, Tanjung Tokong (MY); Kooi Chi Ooi, Glugor (MY)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 16/469,105

(22) PCT Filed: Nov. 22, 2017

(86) PCT No.: PCT/US2017/062973
§ 371 (c)(1),
(2) Date: Jun. 12, 2019

(87) PCT Pub. No.: WO2018/125443
PCT Pub. Date: Jul. 5, 2018

(65) Prior Publication Data
US 2020/0084880 A1    Mar. 12, 2020

(30) Foreign Application Priority Data
Dec. 27, 2016 (MY) .................. 2016704823

(51) Int. Cl.
*H05K 1/02* (2006.01)
*H01L 21/48* (2006.01)
(Continued)

(52) U.S. Cl.
CPC ....... *H05K 1/0224* (2013.01); *H01L 21/4857* (2013.01); *H01L 23/4985* (2013.01);
(Continued)

(58) Field of Classification Search
CPC .............. H05K 1/0224; H01L 21/4857; H01L 21/4853; H01L 23/4985; H01L 23/5383;
(Continued)

(56) References Cited

U.S. PATENT DOCUMENTS 6,294,731 B1 * 9/2001 Lu ...................... H01L 23/433
174/388
9,842,826 B2 * 12/2017 Lin .................... H01L 25/0657
(Continued)

FOREIGN PATENT DOCUMENTS

EP          0523730 A1    1/1993
WO     WO-2008541473 A   11/2008
(Continued)

OTHER PUBLICATIONS

"International Application Serial No. PCT/US2017/062973, International Search Report dated Mar. 12, 2018", 5 pgs.
(Continued)

*Primary Examiner* — Kyoung Lee
*Assistant Examiner* — Christina A Sylvia
(74) *Attorney, Agent, or Firm* — Schwegman Lundberg & Woessner, P.A.

(57) ABSTRACT

A multi-conductor interconnect for a microelectronic device incorporates multiple conductors and integrated shielding for the conductors. The multi-conductor interconnect includes first and second groups of conductors interleaved with one another within a dielectric structure. One of the groups of conductors may be coupled to a reference voltage node to provide shielding for the other group of conductors. The multi-conductor interconnect may further include a
(Continued)

shield layer extending over some portion, or all, of the conductors of the first and second groups.

22 Claims, 10 Drawing Sheets

(51) Int. Cl.
*H01L 23/498* (2006.01)
*H01L 23/538* (2006.01)
*H01L 25/065* (2006.01)
*H01L 23/00* (2006.01)

(52) U.S. Cl.
CPC ...... *H01L 23/5383* (2013.01); *H01L 25/0652* (2013.01); *H01L 25/0657* (2013.01); *H01L 24/85* (2013.01)

(58) Field of Classification Search
CPC ......... H01L 23/49833; H01L 23/49822; H01L 23/49827; H01L 23/5385; H01L 23/49816; H01L 25/0652; H01L 25/0657; H01L 24/85
See application file for complete search history.

(56) References Cited

U.S. PATENT DOCUMENTS

| | | | |
|---|---|---|---|
| 10,622,313 B2* | 4/2020 | Kim | G01R 1/04 |
| 2003/0201519 A1 | 10/2003 | Lamson et al. | |
| 2008/0246126 A1* | 10/2008 | Bowles | H01L 25/50 |
| | | | 257/659 |
| 2010/0244208 A1* | 9/2010 | Pagaila | H01L 23/5389 |
| | | | 257/659 |
| 2011/0049685 A1* | 3/2011 | Park | H01L 23/552 |
| | | | 257/660 |
| 2014/0077389 A1 | 3/2014 | Shim et al. | |
| 2016/0042995 A1 | 2/2016 | Hansen et al. | |

FOREIGN PATENT DOCUMENTS

| | | |
|---|---|---|
| WO | WO-2010020836 A1 | 2/2010 |
| WO | WO-2018125443 A1 | 7/2018 |

OTHER PUBLICATIONS

"International Application Serial No. PCT/US2017/062973, Written Opinion dated Mar. 12, 2018", 7 pgs.

Cahill, Sean S, et al., "Development of 100+ GHz High-frequency MicroCoax Wire Bonds", BridgeWave Communications, Inc. Kulicke & Soffa Industries, Inc IMaps, (2006), 8 pgs.

* cited by examiner

MULTI-CONDUCTOR INTERCONNECT STRUCTURE FOR A MICROELECTRONIC DEVICE

PRIORITY APPLICATION

This application is a U.S. National Stage Application under 35 U.S.C. 371 from International Application No. PCT/US2017/062973, filed Nov. 22, 2017, published as WO 2018/125443, which claims the benefit of priority to Malaysian Application Serial No. 2016704823, tiled 27 Dec. 2016, all of which are incorporated herein by reference in their entireties.

TECHNICAL FIELD

Embodiments described herein relate generally to methods and apparatus for providing interconnections in microelectronic devices; and more particularly relate to methods and apparatus for providing interconnections through an interconnect assembly including multiple conductors and integrated shielding for the conductors.

BACKGROUND

Many forms of microelectronic devices such as IC (integrated circuit) packages include one or more semiconductor die which are coupled to another structure, such as another die or a supporting substrate through various mechanisms. One example technique used in many microelectronic devices is wire bonding between respective contact pads on a die and contact pads on another die, substrate, etc. Such wire bonding requires placement of individual wires extending between the respective locations. In some systems, shielding wires coupled to a voltage reference may be interspersed between some number of signal carrying wires to attempt to minimize crosstalk and other interference. However, because the wires are independent structures, following similar but not identical paths, the provided shielding is less than optimal. Additionally, such wire bonding wires provide minimal shielding relative to external devices or structures and yield substandard channel impedance control due to non-ideal current return paths. As a result, the transmission line impedance performance of wire bonded interconnects is commonly significantly above preferred levels (currently believed to be in the range of 60 to 95 ohms, and preferably in the range of 80-85 ohms). Such impedance mismatch or discontinuity further obstructs the enabling of high speed interconnects, for example in excess of about 2 Gbps or greater, hence limiting device performance scaling.

Additionally, wire bonding increases the vertical height (Z-dimension) of the device, as extra height is needed above the die or other structure to accommodate the nail head of the wire bond, and the loop required for forming a radius extending down to a lower structure. Additionally, in microelectronic device packages including stacked die, the need to provide this loop clearance for wire bonds may require the use of spacers or interposers between die to provide the required space for the wire bond, which further increases the Z dimension of the package. In many microelectronic devices there may be many interconnections required between one or more die and other structures. For example a single die can require, in many cases, forming electrical connections with 200 contacts on the die, with electrical connections with 400 to 500 contacts, and even more contacts, on a die being common. Forming each interconnection individually, as is required with conventional wire bonding techniques, can require substantial assembly throughput time.

BRIEF DESCRIPTION OF THE DRAWINGS

FIGS. 1A-C are schematic representations of an example microelectronic device in accordance with the present description, in which FIG. 1A depicts the device in a cross-sectional view; FIG. 1B depicts the package from a top view; and FIG. 1C depicts an enlarged section of the cross-sectional view of FIG. 1A.

FIGS. 2A-D are schematic representations of an example multi-conductor interconnect generally in accordance with the interconnects depicted in the microelectronic device of FIGS. 1A-C, in which: FIG. 2A depicts a lateral cross-sectional view of the interconnect; FIG. 2B depicts a longitudinal cross-sectional view of the interconnect; FIG. 2C depicts a bottom view of the interconnect; and FIG. 2D depicts a cutaway view sequentially showing the layers forming the interconnect.

DESCRIPTION OF EMBODIMENTS

Figure 1A:
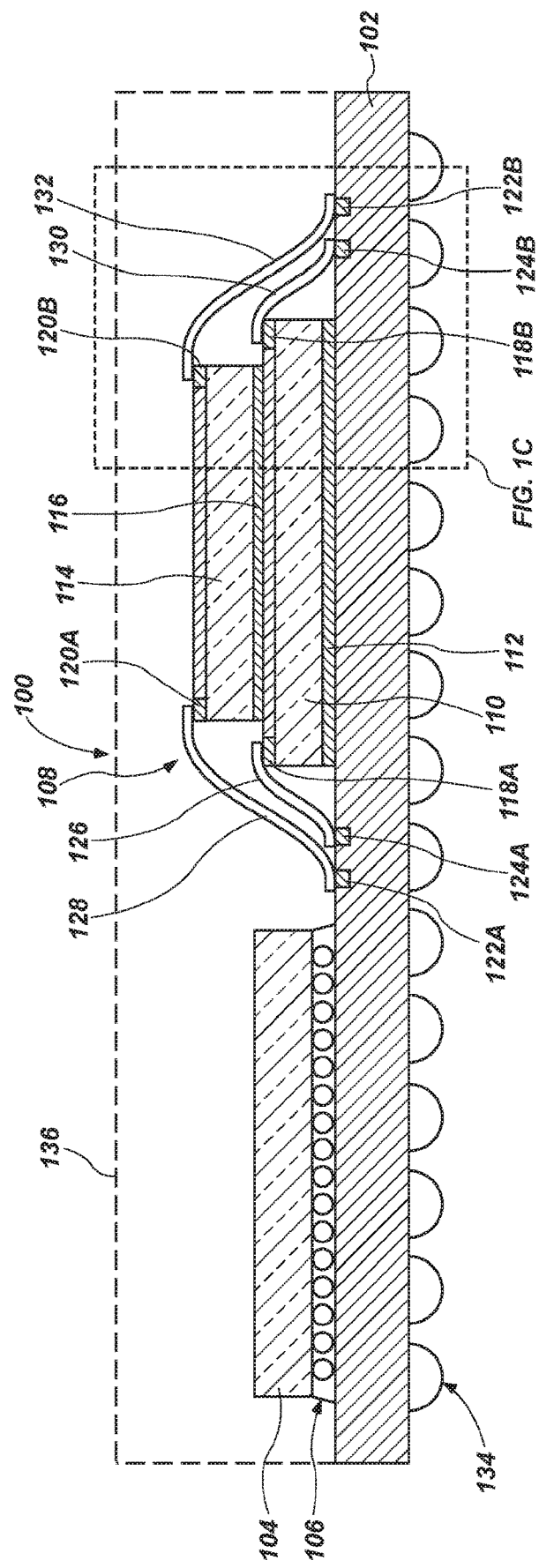

The following description and the drawings sufficiently illustrate specific embodiments to enable those skilled in the art to practice them. Other embodiments may incorporate structural, logical, electrical, process, and other changes. Portions and features of some embodiments may be included in, or substituted for, those of other embodiments. Example embodiments set forth in the claims encompass all available equivalents of those claims.

The present description addresses example embodiments of an interconnect structure incorporating multiple conductors and integrated shielding for the conductors, and further addresses microelectronic devices including that multi-conductor interconnect structure. In some examples as described herein, the multi-conductor interconnect structure may include a first group of multiple conductors extending in spaced relation to one another. The conductors of this first group are constructed to carry signals, and each conductor may include a contact surface of some configuration to facilitate electrical coupling to an electrical contact on a semiconductor die, substrate, or other structure. The interconnect structure may further include a second group of multiple conductors interleaved between the conductors of the first group. The multiple conductors of the second group are constructed to serve as shielding conductors. At least some portion of the conductors of the second group, and in some examples all or substantially all of such conductors of the second group, may be electrically coupled with one another. As described herein, the multi-conductor interconnect structure may further include a dielectric structure extending between the first and second groups of multiple conductors to electrically isolate the conductors of the first and second groups from one another. In many examples, the multi-conductor interconnect structure may further include a reference shield layer extending over some portion, or all, of the conductors of the first and second groups. Though the term "shield layer" is used herein to identify this shield structure, which in many examples may have some portion extending laterally over at least some portion of the multiple conductors of the first and second groups, the shield structure may include additional features or components in addition to the laterally extending portion (or "layer") extending over such conductors. When present, the shield layer may be adapted to connect to reference nodes on different structures. In many examples, the interconnect may be flexible to facilitate coupling the interconnect as desired to establish the electrical connections between structures in the microelectronic device. To avoid unnecessary wordiness in the current description, the term "interconnect" will be used to describe the "multi-conductor interconnect" referred to above. Thus, the two terms should be considered as synonymous in the context of the present description.

When an interconnect structure as described above is used in forming a microelectronic device, all electrical connections between a semiconductor die and another structure (another semiconductor die, a substrate, and interposer, or other structure, etc.) can be made through one or more such interconnects. In other example microelectronic devices, the interconnect may be used only for interconnecting signal paths susceptible to either causing or being disrupted by electromagnetic interference (EMI). For example, signals in a channel operating approximately at or above 2 Gbps can be of concern in some situations. Particular concerns regarding interference may be present in a channel operating at 10 Gbps (5 GHz) or higher. As one example of interference concerns, memory input/output signals transitioning at approximately 2.9 GHz (i.e., a channel operating at 5.8 Gbps), have been found to cause electromagnetic interference with some forms of wireless communication devices, such as, for example, those operating in accordance with the IEEE 802.11 standard and its related standards family. The EMI effect can increase with an increase in frequency of the signals. Memory input/output signals transitioning at 3.2 GHz or above, such as are reflected in the DDR5/LPDDR5 (double rate/low power double data rate) specifications for dynamic random-access memory (DRAM) devices from the JEDEC Solid State Technology Association, have also been found to cause problematic EMI with such wireless devices.

Figure 1B:
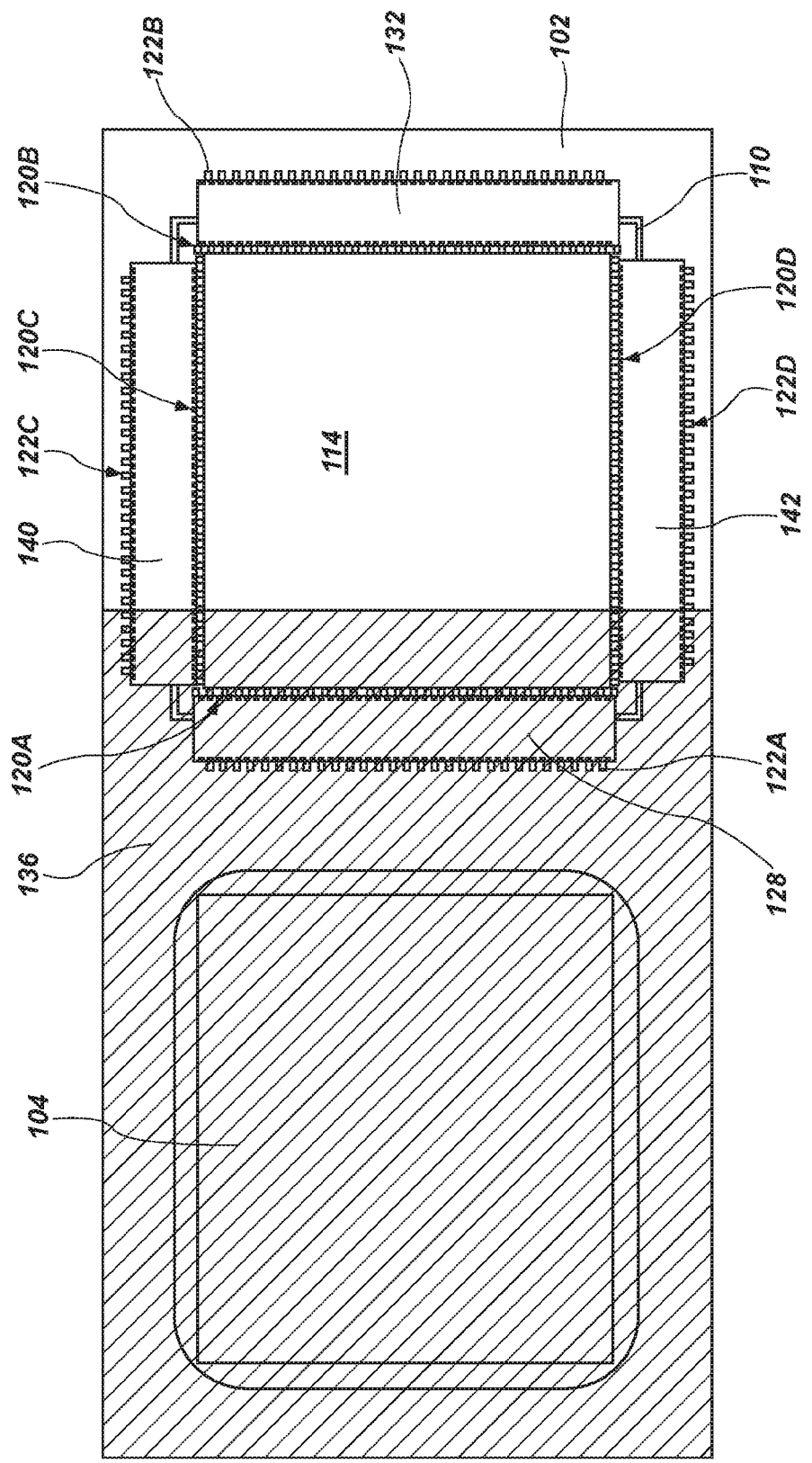
Figure 1C:
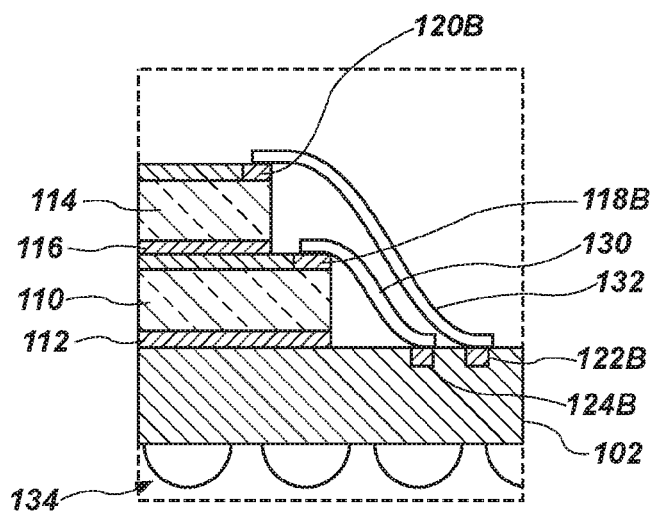

Referring now first to FIGS. 1A-C, the figures schematically depict an example microelectronic device 100, in which FIG. 1A depicts the device 100 in a cross-sectional side view; FIG. 1B depicts the package from a top view; and FIG. 1C depicts an enlarged section of the cross-sectional side view of FIG. 1A. The example microelectronic device 100 includes a support structure, here in the form of a substrate 102. A first die 104 is coupled to substrate 102 in a flip chip configuration, with contacts, indicated generally 106, on first die 104 directly engaging corresponding contacts on substrate 102. Substrate 102 also includes a plurality of external contacts, here in the example form of contact balls, indicated generally at 134, to provide electrical connection with a printed circuit board, such as a motherboard, or another external device or structure. In other examples, the support structure may be another semiconductor die, an interposer, a redistribution structure, or any other structure or device with which electrical connections are needed.

Microelectronic device 100 also includes a stacked die assembly, indicated generally at 108, in which a lower die 110 is secured to substrate 102, such as through a first adhesive layer 112. Additionally, an upper die 114 is secured to lower die 110 again potentially through use of a second adhesive layer 116. For each of upper and lower die 110, 114, the die are located with their active surfaces facing upwardly, away from substrate 102. As a result, a first group of contacts 118A, 118B, extends along each side of lower die 110. Similarly, additional groups of contacts 120A, 120B extend along either side of upper die 114. In the depicted example, two groups of contacts 122A, 122B, 124A, 124B (each arranged in a linear row) are formed on substrate 102 on opposite sides of lower die 110.

In the depicted example, respective contacts within contact group 118A on lower die 110 are coupled to respective contacts within contact group 124A on substrate 102 through a first interconnect structure 126; and respective contacts within contact group 120A on upper die 114 are coupled to respective contacts within contacts 122A on substrate 102 through a second interconnect structure 128. In a similar manner, respective contacts within contact group 118B on lower die 110 are coupled to respective contacts within contact group 124B on substrate 102 through a third interconnect structure 130; and respective contacts within contact group 120B on upper die 114 are coupled to respective contacts in contact group 122B on substrate 102 through a fourth interconnect structure 132. An example configuration for each interconnect structure will be discussed in more detail in reference to FIGS. 2A-D. In the depicted example, the components of microelectronic device 100 are encased within an enclosure 136, such as a molded component.

Referring now specifically to FIG. 1B, the schematically represented top view of microelectronic device 100 depicts an example embodiment wherein upper die 114 includes additional rows of contacts 120C, 120D on the remaining two sides of upper die 114 not visible in the cross-section of FIG. 1A. Respective contacts within each of rows 120C, 120D are coupled to respective contacts in additional rows of contacts on the substrate, as indicated at 122C, 120D, through additional interconnect structures 140, 142. As a result, different groups of contacts, in this example extending along adjacent sides of the die, are connected through respective interconnects which extend generally perpendicularly to one another. Additionally, as can be seen in FIG. 1A, interconnects extending to different groups of contacts can extend over one another (as will also be discussed in reference to FIG. 3A). The interconnects 126, 130 extending between the lower die 110 and the substrate are not visible in the top view of FIG. 1B, due to the presence of interconnect structures 128, 132, extending above them. Lower die 110 may also have groups of contacts extending along all four edges, and coupled through respective interconnects to additional rows of contacts on substrate 102, in a manner directly analogous to the connections between upper die 114 and substrate 102.

Figure 2A:
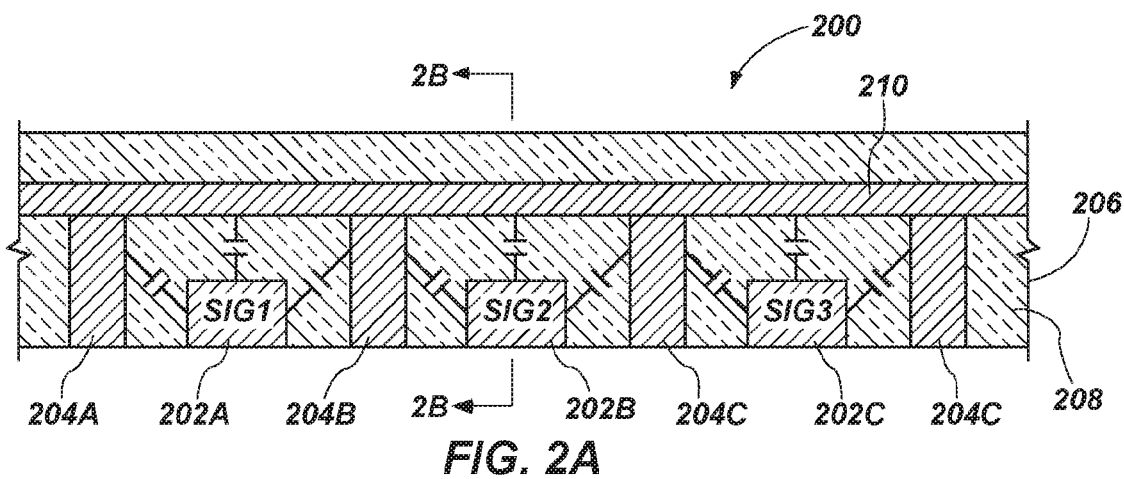
Figure 2B:
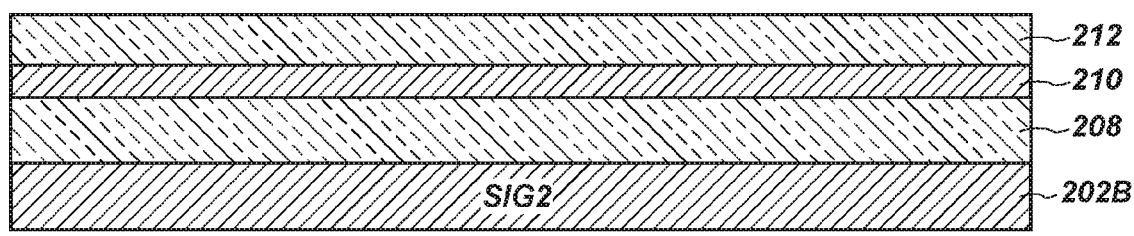
Figure 2C:
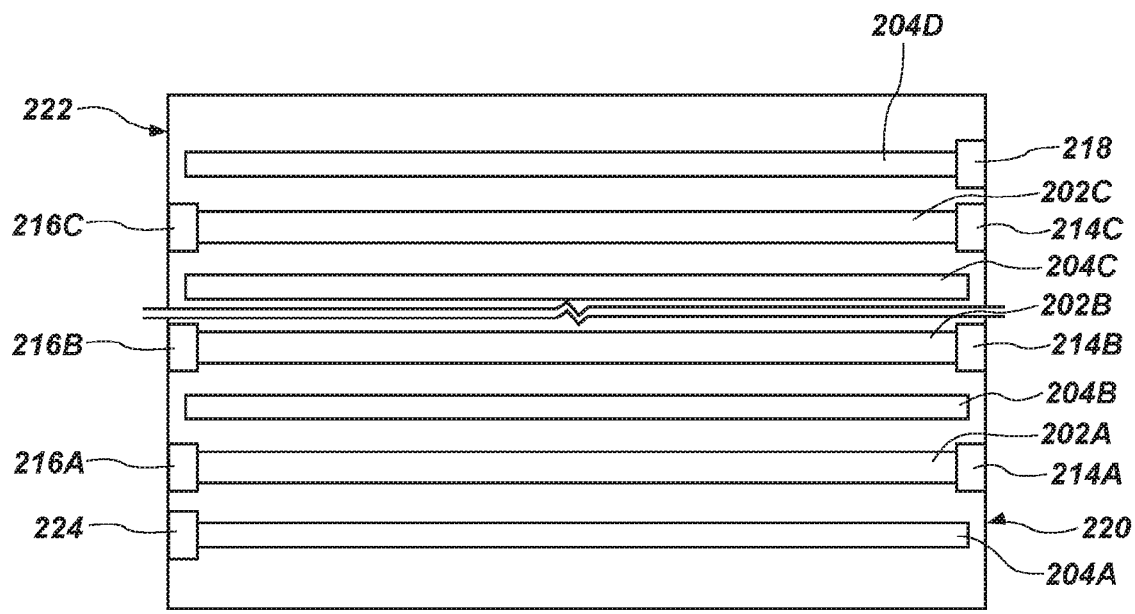
Figure 2D:
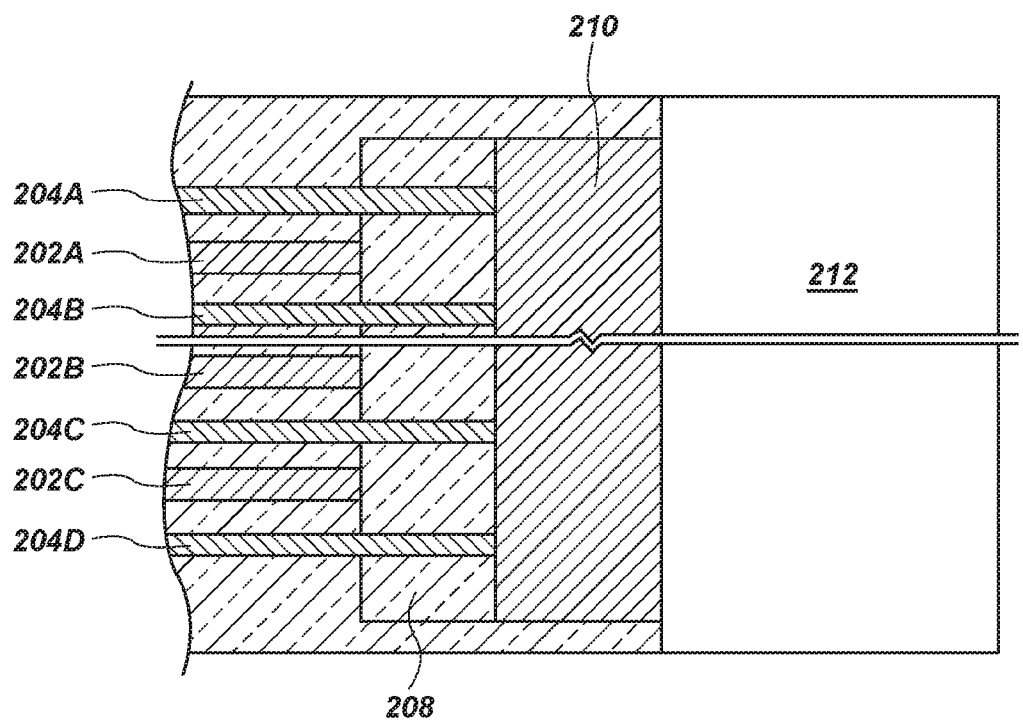

Referring now to FIGS. 2A-D, the figures schematically depict a representative portion of an example structure for an interconnect 200 generally in accordance with the interconnect structures depicted in the microelectronic device of FIGS. 1A-C, in which: FIG. 2A depicts a lateral cross-sectional view of the interconnect; FIG. 2B depicts a longitudinal cross-sectional view of the interconnect (along line 2B-2B in FIG. 2A); FIG. 2C depicts a bottom view of the interconnect; and FIG. 2D depicts a cutaway view sequentially showing the layers forming the interconnect 200.

As shown in FIG. 2A, interconnect 200 includes a first group of conductors, represented by conductors 202A-C. Conductors 202A-C may be signal carrier conductors in interconnect 200 (as opposed to shielding conductors). The example cross-section is shown for purposes of illustration only, and represents only a small segment of an interconnect that may be constructed in accordance with the present disclosure. In some example systems, a single interconnect may have as few as 2 conductors in the first group (i.e., signal conductors). Though in many example systems, such as those in which the interconnect is used to provide larger scale chip-to-chip interconnection, the interconnect may include substantially more signal conductors. For example, interconnects for such applications may include 50 or more signal conductors, and in many cases may include at least 200 signal conductors, with 400 to 500, or more, signal conductors also being contemplated for interconnects in accordance with the present disclosure.

Interconnect 200 also includes a second group of conductors, represented by conductors 204A-D. In the depicted example the second group of conductors may be shielding conductors. In many examples, the second group of conductors may be interleaved with the first group of conductors. In the depicted example, the interleaving is in a 1-to-1 ratio, where every signal conductor 202A-C may represent a single-ended bus, and is separated from another signal conductor by a respective second (shielding) conductor (i.e., the conductors of the first and second groups alternate along the cross-section of the interconnect). Other degrees of interleaving are contemplated. An example alternative interleaving arrangement may be applied, for example, in interconnects providing a differential bus utilizing a pair of conductors to carry a set of signals across the interface. In some examples of that structure, the interconnect may include signal conductors in a 2-to-1 ratio to shielding conductors. Other examples may include a 2-to-1 (or greater) ratio of signal conductors to shielding conductors in examples other than those establishing a differential bus. Additionally, the interleaving need not be identical across the width of the interconnect. For example, in portions of the interconnect carrying signals operating at a high transition rate, the interleaving may be in a 1-to-1 ratio, as depicted in FIG. 2A, to provide maximum shielding, while in other regions across the width of the interconnect that are intended to carry lower transition rate signals (therefore presenting less risk of causing, or being impacted by, electrical interference), the interleaving might be to place a shielding conductor between every two or three signal conductors (therefore having signal conductors present in a 2 to 1, or 3 to 1, or other desired ratio, to shielding conductors), in that region of the interconnect.

In the example of interconnect 200, the first and second groups of conductors are electrically isolated from one another by a dielectric structure, indicated generally at 206. In the depicted example, dielectric structure includes a first vertical layer, indicated generally at 208, which extends above and around each conductor of the first group of conductors 202A-C, and therefore extends between each conductor of the first group and the adjacent conductors of the second group, isolating those conductors of the first group from adjacent conductors of the second group 204A-D. The depicted example interconnect 200 also includes a conductive shield layer 210 which extends along the width of the interconnect and above each conductor of the first group (202A-C). In one desirable configuration, each conductor of the second group 204A-D extends to and engages shield layer 210, which extends as a generally planar structure (at least prior to any flexing of interconnect 200). In view of the presence of shield layer 210, dielectric structure 206 also includes a second vertical layer, indicated generally at 212, which extends over shield layer 210 (and which may extend around a portion of shield layer 210, such as, for example, on the terminal ends or sides of the interconnect 200).

As can best be seen in the bottom view of interconnect 200 of FIG. 2C, each conductor of the first group 202A-C includes contact surfaces at each end of interconnect 200, as shown at 214A-C proximate a first end (indicated generally at 220), of interconnect 200, and at 216A-C, proximate a second end (indicated generally at 222), of interconnect 200. Contact surfaces 214A-C and 216A-C are sized and configured to facilitate their bonding to respective contacts on a die, substrate or other structure (as discussed in reference to FIGS. 1A-C).

In many examples, not all conductors of the second group 204A-D will include contact surfaces to enable respective direct connections to other structures. Because these conductors are shielding conductors, a first contact surface 218 at the first end 220, and a second contact surface 224 at the second end 222 may be sufficient, in many examples, to connect to respective reference voltage nodes on the mating structures (such as a first reference voltage node on a semiconductor die and a second reference voltage node on the supporting structure), and to provide electrical communication between those reference voltage nodes through conductors 204A-D and, in this example, through shield layer 210. For the example configuration of the example interconnect, placing of the shielding contact surfaces 218, 224 diagonally opposite one another in interconnect 220 is believed to balance voltage and current flow across the shielding components. However in other examples, which may include interconnects having a relatively larger number of signal conductors (As one example, over 100 or more signal conductors), it may be desirable to include additional connections of one or more shielding conductors to the reference nodes across the width of the interconnect provide desired referencing of the shielding structures.

Figure 3A:
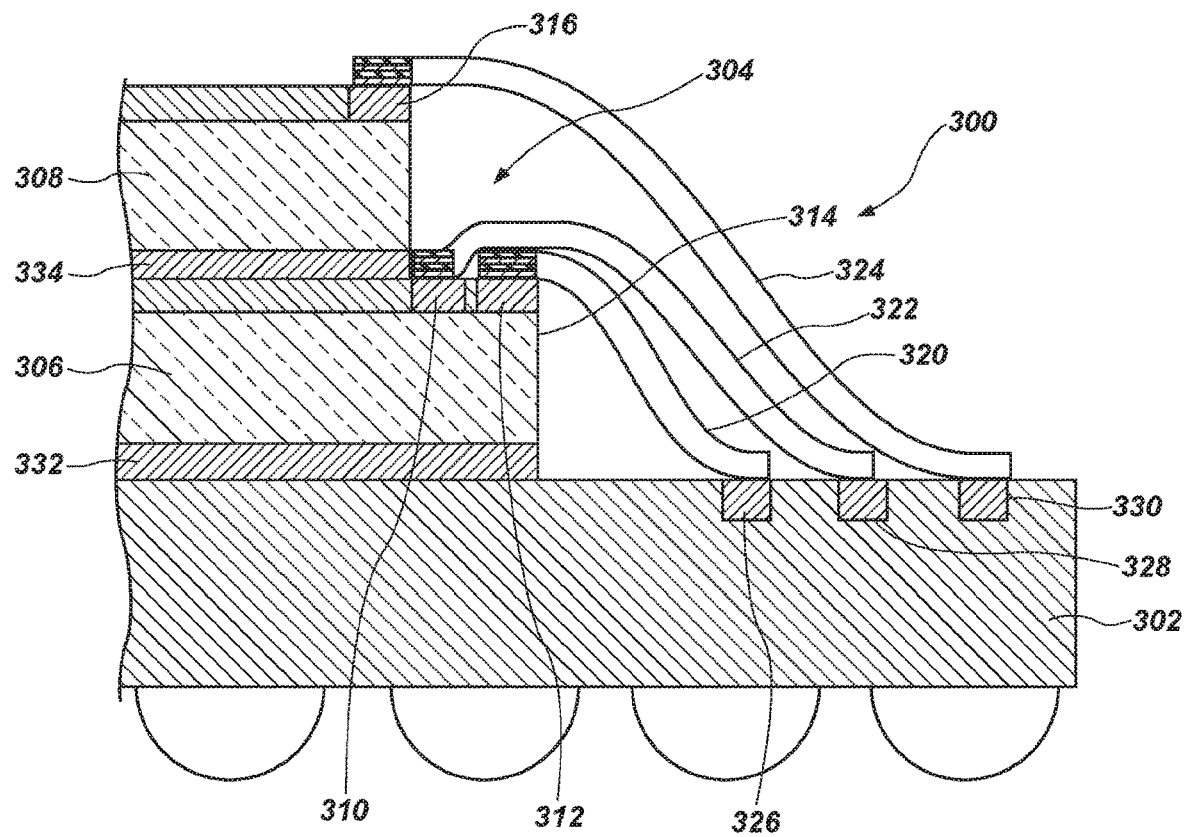
FIGS. 3A-B are each schematic cross-sectional schematic representations of alternative examples of microelectronic device structures including multi-conductor interconnects as described herein.
Figure 3B:
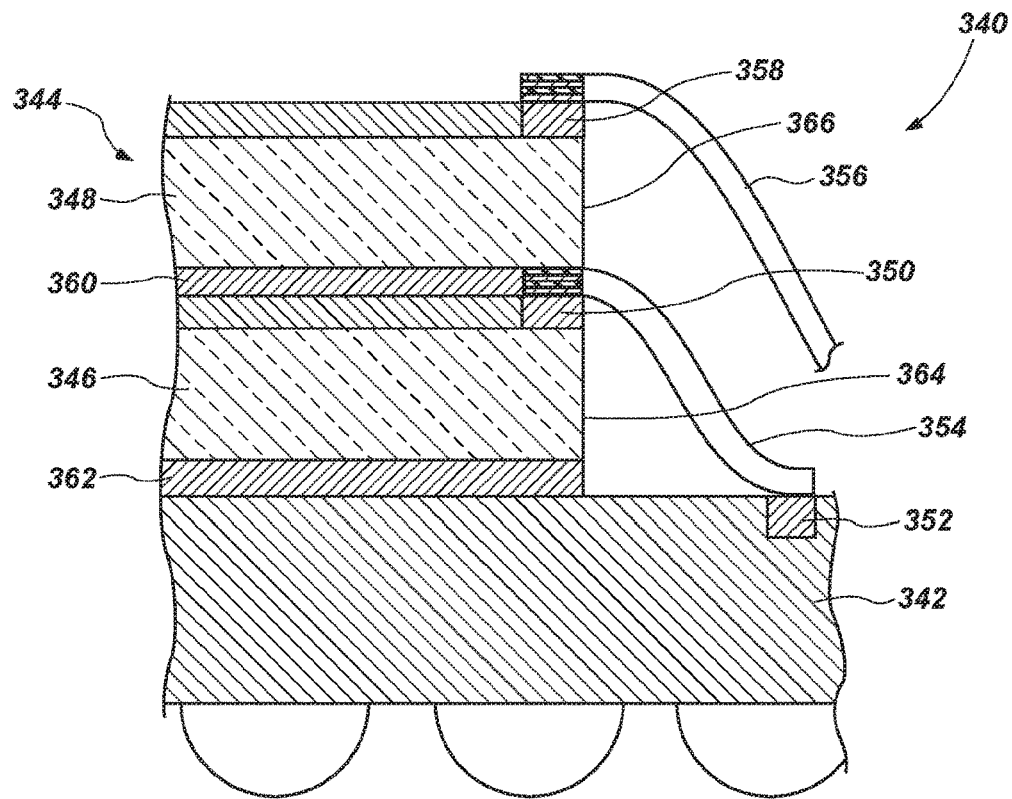

Referring now to FIGS. 3A-B, each figure depicts a schematic cross-section of a respective microelectronic device structure including interconnects as described herein. FIG. 3A depicts a representative portion of a microelectronic device 300 in which a substrate 302 supports a stacked die assembly, indicated generally at 304 including a lower die 306 and an upper die 308. Lower die 306 may be coupled to substrate 302 by an adhesive layer 332, and similarly, upper die 308 may be coupled to lower die 306 by a similar adhesive layer 334.

Lower die 306 includes two groups of contacts 310, 312 which in many example configurations may be arranged in generally parallel lines of repeating (and in many examples, equally spaced) contacts on the active surface and along the depicted edge 314 of lower die 306. In the depicted example, upper die 308 includes only a single group of contacts 316, again preferably arranged in a row (extending perpendicular to the plane of the figure) on the upper surface of the die. Each group of contacts 310, 312, 316, is coupled by a respective interconnect 320, 322, 324 (which may each be of the configuration as discussed above in reference to FIGS. 2A-D), to a respective group of contacts on substrate 302, as indicated at 326, 328, 330. For clarity of illustration, interconnects 320, 322, 324 are not depicted entirely in cross-section, except at the upper terminal end wherein the contact surfaces (214A-C in FIG. 2) on the first group of conductors (202A-C in FIG. 2) of each interconnect 320, 322, 324, are coupled to respective contacts 310, 312, 316 on lower die 306 and upper die 308. In the example of FIG. 3A, the use of the described interconnects facilitates an improved input/output (I/O) density between lower die 306 and substrate 302 with less package substrate real-estate consumption (i.e., through tighter spacing between respective group of contacts on substrate 302 e.g. 326, 328, 330), and provides greater protection against short circuits, than would be available using conventional wire bonding techniques. Accordingly, interconnect 322 can extend over interconnect 320 to engage contact group 310 because of the dielectric layer along the upper surface of interconnect 320 (as can be seen at 212 in FIGS. 2A-B, and D).

FIG. 3B depicts a representative portion of an alternative structure for a microelectronic device 340 in which a substrate 342 supports a stacked die assembly, indicated generally at 344, including a lower die 346 and an upper die 348. Lower die 306 may again be coupled to substrate 342 by an adhesive layer 362, and similarly, upper die 348 may be coupled to lower die 346 by similar adhesive layer 360. The configuration of the stacked lower die 346 and upper die 348 differs from that of FIG. 3A in that rather than upper die 308 having an edge which is set back from edge 314 of lower die 306, as shown in that figure, in microelectronic device 340 the lower die 346 and upper die 348 can be arranged with edges 364, 366 essentially flush with one another. This configuration would not be possible with conventional wire bonding techniques due to the vertical space required for the wire bonding loops. With such conventional wire bonding techniques, if die were to be stacked with generally aligned edges as shown in FIG. 3B, an interposer or other spacer would need to be placed between the die to accommodate the wire bonding, and such would then add to the Z-dimension of the die stack.

Such increased dimensions are avoided by the use of the described interconnect 354 to connect with a group of contacts, as indicated generally at 350 on lower die 346, and to electrically couple those contacts to respective contacts of group 352 on substrate 342. Again, interconnect 354 may be in the configuration discussed above in reference to FIGS. 2A-D. As shown in the figure, interconnect 354 can be coupled with contacts of contact group 350 essentially in the vertical space established by adhesive layer 360. A second interconnect 356 can couple respective contacts of a group of contacts as generally indicated at 358 to contacts on substrate 342 (not depicted).

Figure 4:
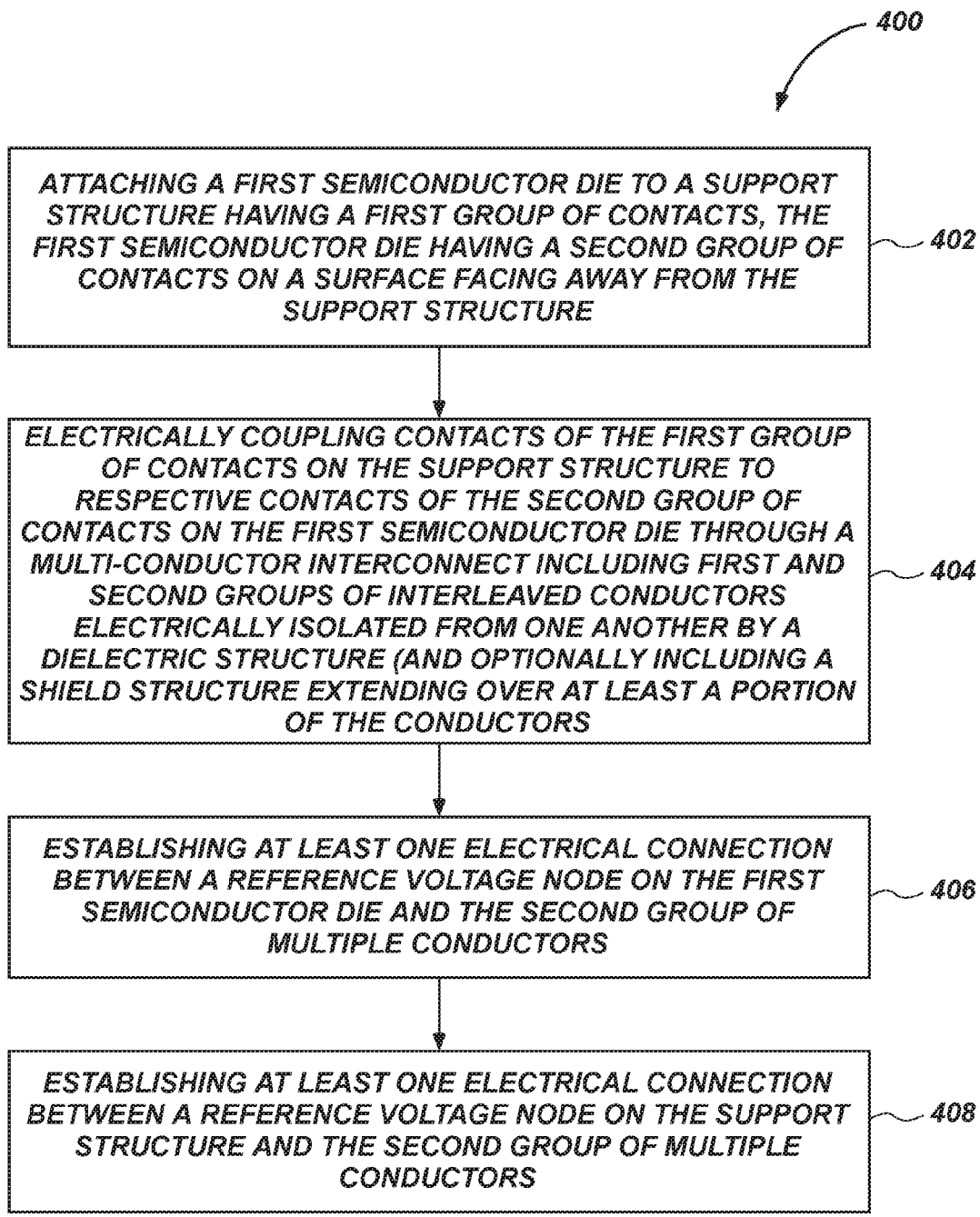
FIG. 4 is a flowchart of an example process for forming a microelectronic device incorporating at least one interconnect of the type described herein.

Referring now to FIG. 4, the figure depicts a flowchart of an example process 400 for forming a microelectronic device incorporating at least one interconnect of the type described herein. As indicated at 402, a first semiconductor die is attached to a support structure having a first group of contacts; and the first semiconductor die includes a second group of contacts on its active surface, which is placed facing away from the support structure. In the current example the support structure may be in the form of a substrate. However as discussed elsewhere herein, in other examples the support structure may be another semiconductor die, an interposer, a spacer, or another redistribution structure, or any structure or device for which electrical communication with the first semiconductor die is required. For example, in some embodiments the first semiconductor die may be a processor, while in other embodiments the first semiconductor die may be another device including, but not limited to, a memory device, a chipset, a field programmable grid array (FPGA), or graphics processor, etc. In other examples, the support structure may be a semiconductor die, and may be or include any one or more of a processor, a memory device, a chipset, a field programmable grid array (FPGA), or a graphics processor, etc.

As indicated at 404, contacts of the first group of contacts on the support structure are electrically coupled to respective contacts of the second group of contacts on the first semiconductor die through a interconnect. In the example process, the interconnect may have a structure analogous to that discussed in reference to FIGS. 2A-D: (i) a first group of multiple conductors extending in spaced relation to one another, with each conductor having contact surfaces on opposing ends, the contact surfaces configured to mechanically and electrically coupled to the identified contacts; (ii) second group of multiple conductors interleaved between the conductors of the first group of multiple conductors, with at least some portion of the conductors of the second group electrically coupled with one another; and (iii) a dielectric structure extending between the conductors of the first and second groups and retaining the first and second groups of multiple conductors in the respective orientations. The electrical coupling of the contact surfaces of the interconnect with respective contacts of the identified groups can be accomplished through various techniques, including thermal compression bonding (which optionally can include use of anisotropic conductive film), a solder reflow or diffusion process, surface activated bonding, etc. In an example solder reflow process, pre-formed solder paste may be applied to the contacts on both the semiconductor die and the support structure through stencil printing prior to the solder reflow process.

As indicated at 406, the example process also may include establishing at least one electrical connection between a reference voltage node on the first semiconductor die and the second group of multiple conductors. Similarly, as indicated at 408, at least one electrical connection is established between a reference voltage node on the support structure and the second group of multiple conductors.

Additionally, in many examples, the interconnect may also include a reference structure (again including a laterally extending "layer" as discussed earlier herein) extending over at least a portion of the first and second sets of conductors. In such examples in which such a shield layer is also present, an electrical connection may also be established between the reference voltage nodes and the shield layer. As described in reference to FIGS. 2A-D, one desirable way of establishing that electrical connection is through direct electrical connection of the second group of multiple conductors with the shield structure.

The reference voltage nodes can be at any desired potential for shielding, but commonly may be either ground or $V_{cc}$. Where a shield layer extending over the conductors is present, the shield layer may also be coupled to the reference voltage nodes. In many examples, the connection of the shield layer with the reference voltage nodes may be through the second group of multiple conductors.

Figure 5:
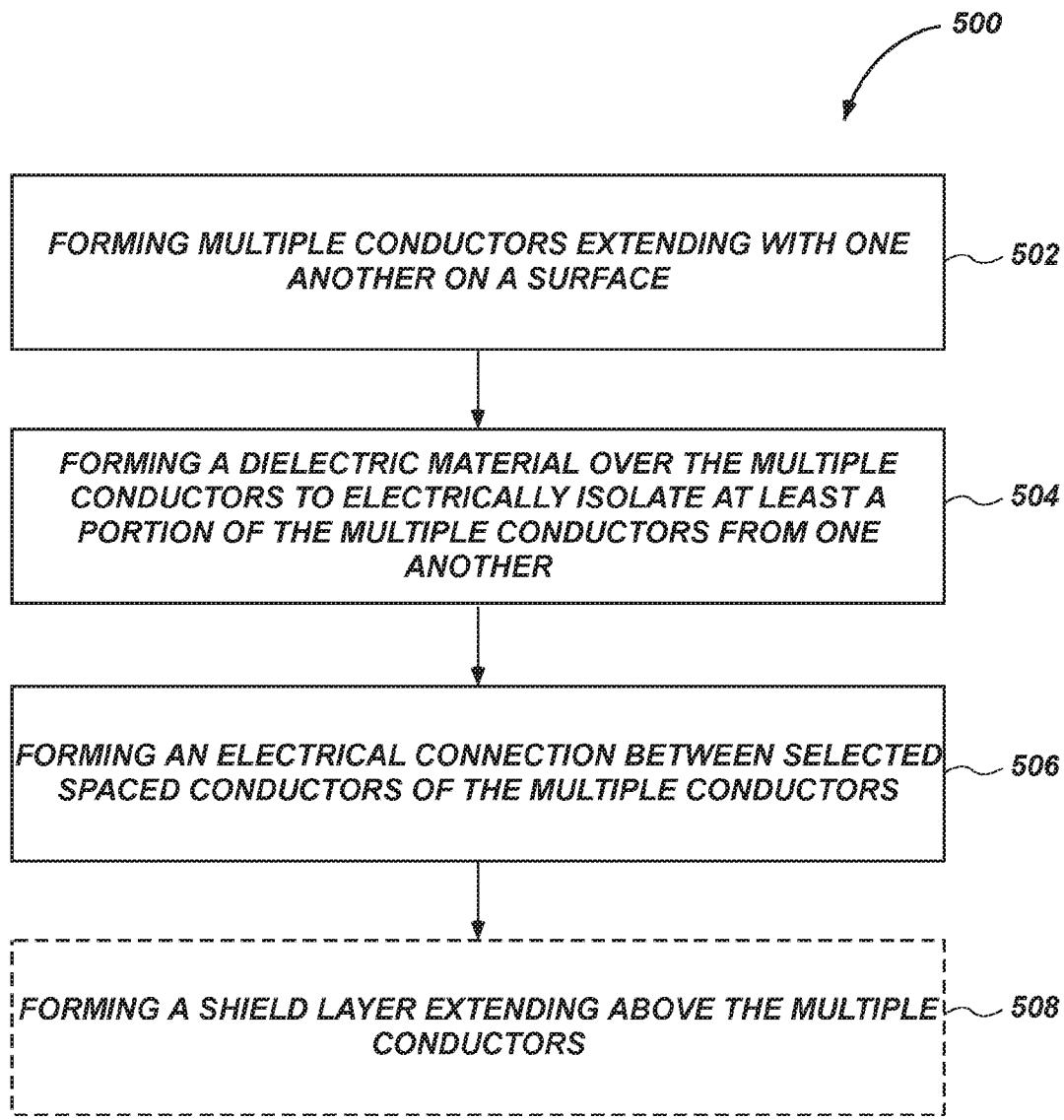
FIG. 5 is a flowchart of an example process for forming a microelectronic device interconnect of the type described herein.
Figure 6A:
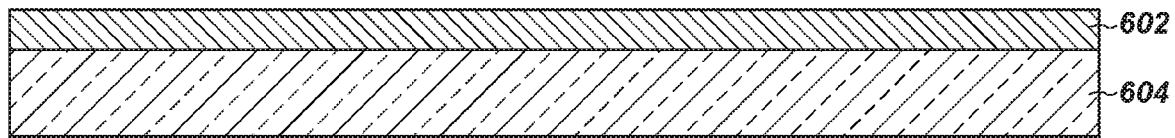
FIGS. 6A-F are schematic cross-sectional representations of representative stages in an example process for forming microelectronic device interconnect of the type described herein.
Figure 6B:
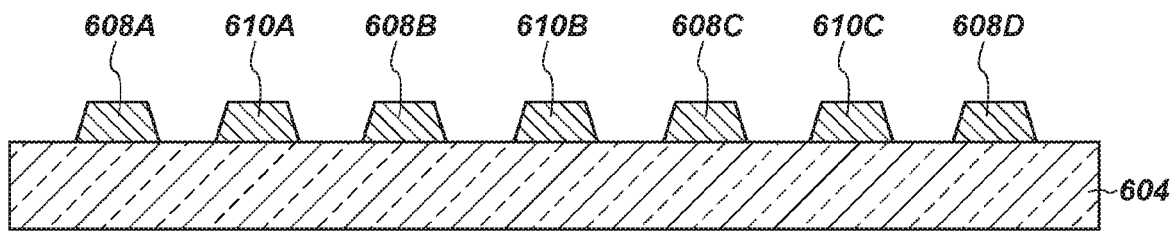

Referring now to FIG. 5, the figure depicts a flowchart of an example process 500 for forming a microelectronic device interconnect of the type described herein. The description of the identified process will also be made in reference to FIG. 6A-F, which depict schematic cross-sectional representations during example stages of possible implementations of process 500. As indicated at 502, multiple conductors are formed extending with one another on a surface. One example way of forming these conductors is through use of a metal layer 602, which may be for example a metal foil, laminated onto a carrier 604. That metal layer can then be patterned to define the individual conductors from layer 602, as depicted in FIG. 6B. Though in the depicted cross section the individual conductors are shaped identically, as can be seen in reference to FIG. 2C, in other cross-sections the contact surfaces may be formed on some conductors, and the resulting cross-sections will appear different than the depicted cross section. Because the patterned conductors may be parts of different groups of conductors, they are identified with numbers accordingly, with conductors 610A-C being conductors of the first (signal) group, and conductors 608A-D being conductors of the second (shielding) group.

The metal foil (or other metal structure) may be patterned, for example, by routing and/or laser cutting of the metal, or by photolithography and etching. In many examples, the metal may be copper or a copper-containing alloy, or in some examples aluminum. Any suitable metal providing appropriate conductivity may be used in the described interconnects.

In other examples, rather than forming the individual conductors from a patterned metal layer, metal conductors, such as wires (for example, wire bonding wire) may be arranged to extend alongside one another in the desired arrangement. Those wires may then be electrically isolated from one another and retained in their desired orientation, through use of a dielectric material, as described below.

An example of the configuration of the multiple conductors can be seen in FIG. 2C. In the example of that figure, and in many other examples, the multiple conductors may extend generally parallel to one another. However that orientation is not required. For example, in some microelectronic devices, the spacing of the first group of contacts on a semiconductor die may be different from the spacing of a second group of contacts on a substrate or other structure to be electrically coupled to the die. In that circumstance, conductors in the interconnect may be arranged, for example, not in parallel, but in a fanned pattern to facilitate the spatial transition between such first and second groups of contacts.

Referring again to FIG. 5, as indicated 504, a dielectric material is then formed over the multiple conductors to electrically isolate at least a portion of the multiple conductors from one another. The dielectric material can be of many suitable compositions, including, for example, one or more of polyimide, polyamide, bismaleimide-triazine resin, benzocyclobutene (BCB), polyurethanes, high-density polyethylene (HDPE), poly (4,4'-oxydiphenylene-pyromellitimide) and polyethylene terephthalate, etc. As noted previously, preferably the dielectric material may be sufficiently flexible as to ease forming of the interconnect into a shape to provide the connections as described herein. Thus, flexibility of the dielectric, and of the formed interconnect, refers to the ability of the interconnect to be formed in a first configuration (such as a generally flat structure, as shown in the examples herein), and to be shaped sufficiently to couple to respective groups of contacts. In many examples, the contacts may be oriented vertically offset from one another but facing in the same direction, as is common with applications in which wire bonding is used.

Figure 6C:
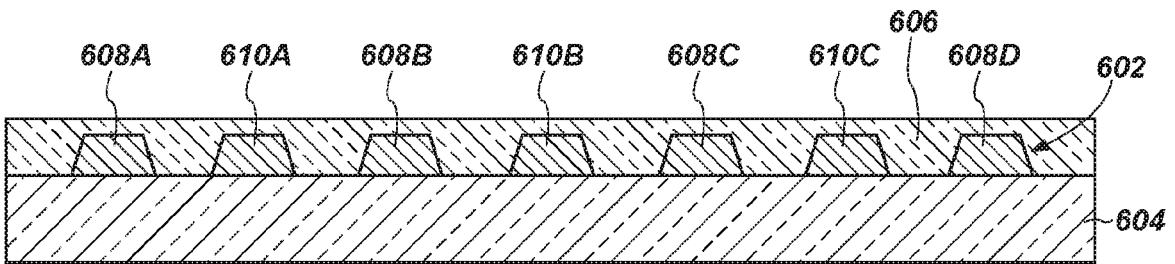

As can be seen in FIG. 6C, a dielectric material layer 606 has been deposited over the patterned conductors 610A-C and 608A-D. In the present example, the dielectric material layer 606 thickness and the conductor spacing define the distance between the signal conductors and the shielding conductors. A wide variety of material spacings within the interconnect may be utilized as appropriate for any specific application. An example spacing suitable for use with high-frequency signals as discussed earlier herein is a spacing of 10 to 20 μm, though such spacing may be adjusted depending upon the impedance target for the conductive channel through the interconnect.

As indicated at 506, an electrical connection is formed between selected spaced conductors of the multiple conductors; and as indicated at 508 an optional reference shield structure is formed extending above the multiple conductors. In the present example of FIGS. 6A-F, the electrical interconnection between spaced conductors of the multiple conductors may be formed through forming of the shield layer.

Figure 6D:
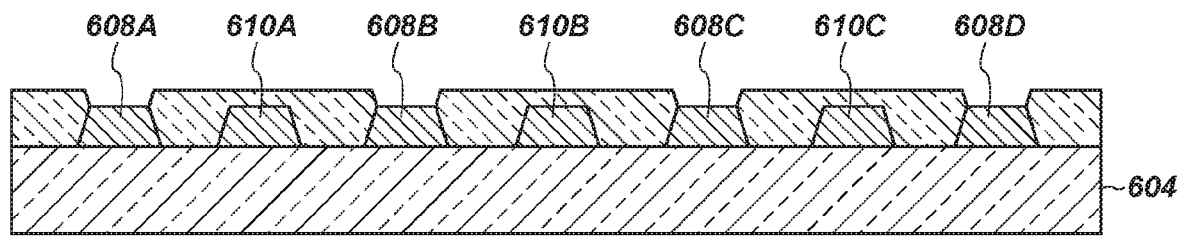
Figure 6E:
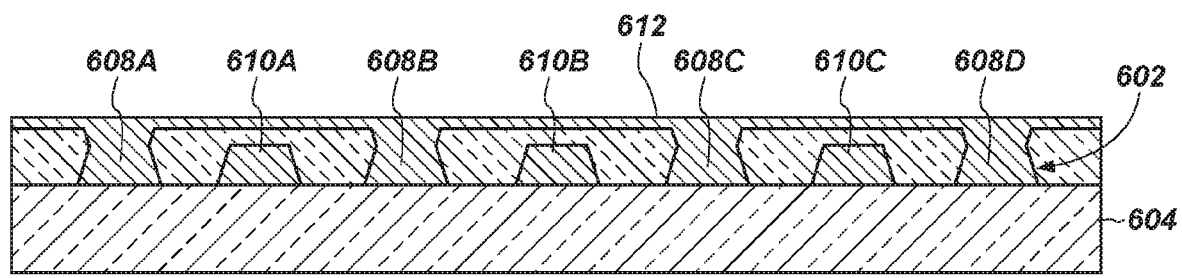
Figure 6F:
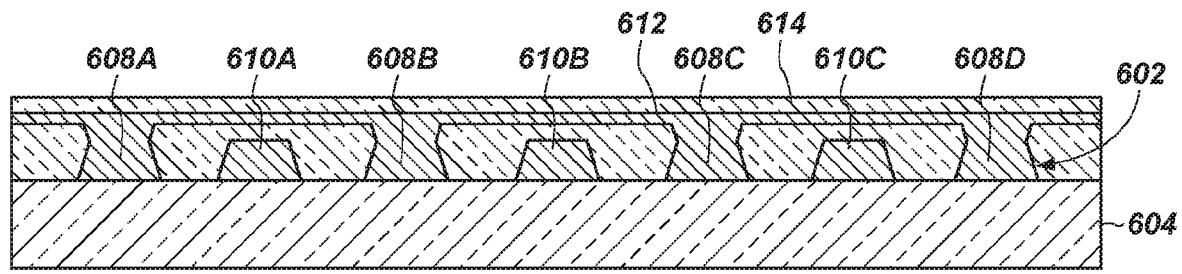

As shown in FIG. 6D, an example of implementation of the above operations is for dielectric layer 606 to be patterned to expose surfaces of alternate (shielding) conductors 608A-D, while leaving dielectric extending around and over interleaved (signal) conductors 610A-C. A metal layer 612 may then be formed to extend from exposed tops of shielding conductors 608A-D and to form a shield layer extending across at least a substantial portion of the width of the interconnect being formed. In the depicted example the shield layer contacts the shielding conductors 608A-D along at least a portion of their length, and in many examples along substantially all of their length. Thus, viewed in cross-section as in FIG. 6E, the shield structure has a comb-like configuration extending over and around the signal conductors 610A-C. In some examples, metal layer 612 may be formed by an electroplating process. In some such processes, a metallic seed layer may be sputtered onto the structure such as that of FIG. 6D, and then copper or another material may be electroplated over the seed layer.

In many examples, another dielectric layer 614 may form a portion of the dielectric structure of the interconnect and may extend around the sides of the conductors at the lateral ends of the interconnect. When present, dielectric layer 614 can be of the same material as used for dielectric layer 606; or in some cases may be formed of a different material. For example, it may be desirable to have dielectric layer 614 formed of a more abrasion-resistant material. For applications in which the interconnect is not expected to have another interconnect (or other conductive structure) extending above or nearby, the upper dielectric layer 614 may be omitted. The described example process facilitates forming of flexible interconnects having a thickness of approximately 30 μm to about 70 μm, though as noted above, dimensions of the described structures of the interconnect may be adjusted in response to a desired characteristic impedance of the channel.

Subsequently, the formed interconnect may be singulated and removed from the carrier as a discrete interconnect structure. In some examples, the formed interconnect may be singulated through mechanical sawing or laser cutting. The interconnect may then be used as described herein for connecting a semiconductor die with another die or other support structure.

As noted earlier, many types of semiconductor die may be beneficially packaged together in a microelectronic device in the manner described herein. One example of such a beneficial combination would be in connecting a processor to a substrate or other structure through use of a multi-conductor interconnect as described herein; or wherein another device type, for example memory device(s), a chipset, a field programmable grid array (FPGA), graphics processor, etc. may be connected with each other, a substrate, or another structure through use of a multi-conductor interconnect. The resulting microelectronic device may then be included in a larger electronic device or system, as described below.

Figure 7:
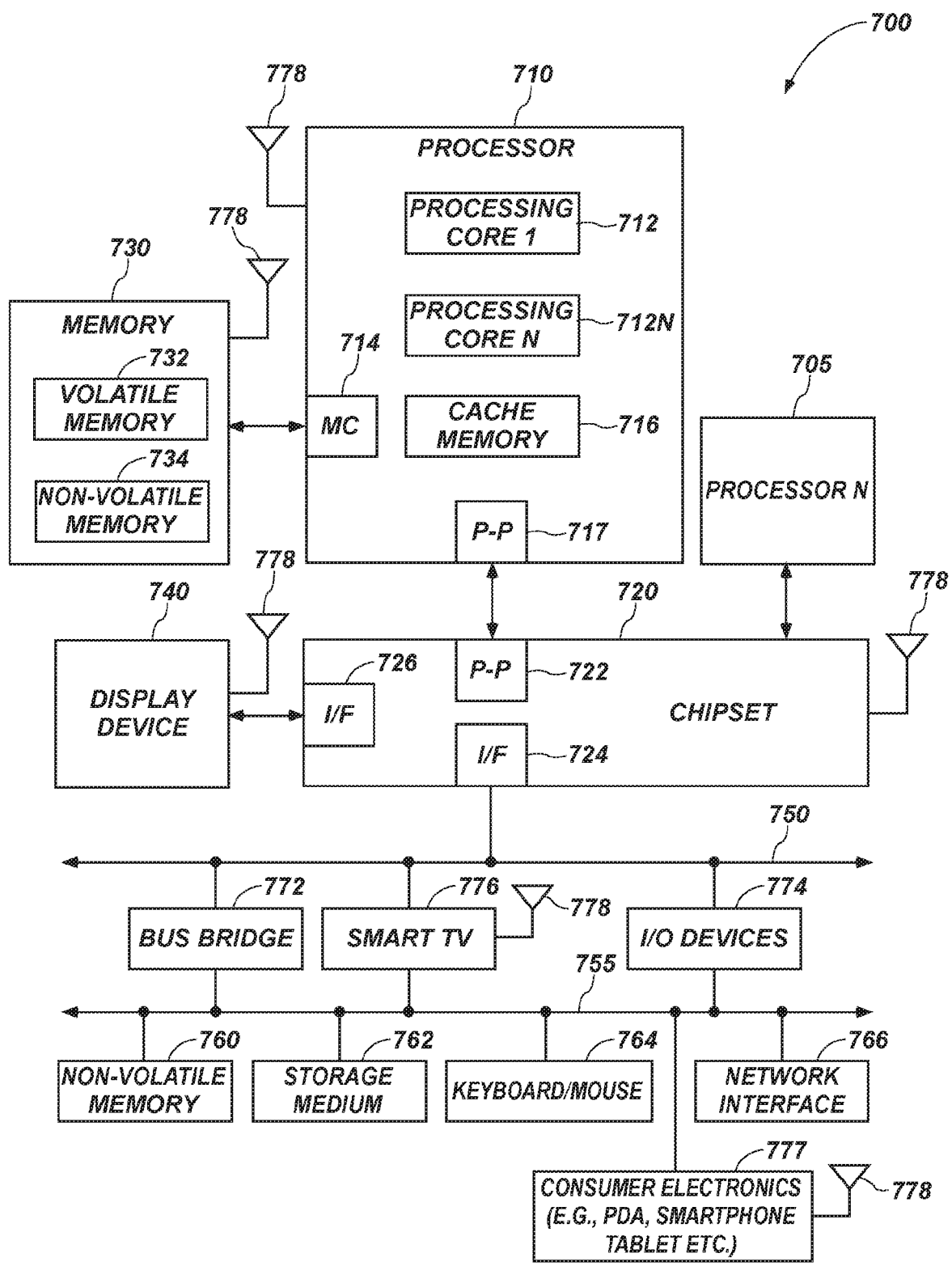
FIG. 7 is block diagram of an electronic system which may incorporate a microelectronic device including one or more multi-conductor interconnects as described herein.

FIG. 7 illustrates a system level diagram, according to one embodiment of the invention. For instance, FIG. 7 depicts an example of an electronic device (e.g., system) including one or more microelectronic devices including one or more interconnects as described herein. FIG. 7 is included to show an example of a higher level device application for the present invention. In one embodiment, system 700 includes, but is not limited to, a desktop computer, a laptop computer, a netbook, a tablet, a notebook computer, a personal digital assistant (PDA), a server, a workstation, a cellular telephone, a mobile computing device, a smart phone, an Internet appliance or any other type of computing device. In some embodiments, system 700 is a system on a chip (SOC) system.

In one embodiment, processor 710 has one or more processing cores 712 and 712N, where 712N represents the Nth processor core inside processor 710 where N is a positive integer. In one embodiment, system 700 includes multiple processors including 710 and 705, where processor 705 has logic similar or identical to the logic of processor 710. In some embodiments, processing core 712 includes, but is not limited to, pre-fetch logic to fetch instructions, decode logic to decode the instructions, execution logic to execute instructions and the like. In some embodiments, processor 710 has a cache memory 716 to cache instructions and/or data for system 700. Cache memory 716 may be organized into a hierarchal structure including one or more levels of cache memory.

In some embodiments, processor 710 includes a memory controller 714, which is operable to perform functions that enable the processor 710 to access and communicate with memory 730 that includes a volatile memory 732 and/or a non-volatile memory 734. In some embodiments, processor 710 is coupled with memory 730 and chipset 720. Processor 710 may also be coupled to a wireless antenna 778 to communicate with any device configured to transmit and/or receive wireless signals. In one embodiment, the wireless antenna interface 778 operates in accordance with, but is not limited to, the IEEE 802.11 standard and its related family, Home Plug AV (HPAV), Ultra Wide Band (UWB), Bluetooth, WiMax, or any form of wireless communication protocol.

In some embodiments, volatile memory 732 includes, but is not limited to, Synchronous Dynamic Random Access Memory (SDRAM), Dynamic Random Access Memory (DRAM), RAMBUS Dynamic Random Access Memory (RDRAM), and/or any other type of random access memory device. Non-volatile memory 734 includes, but is not limited to, flash memory, phase change memory (PCM), read-only memory (ROM), electrically erasable programmable read-only memory (EEPROM), or any other type of non-volatile memory device.

Memory 730 stores information and instructions to be executed by processor 710. In one embodiment, memory 730 may also store temporary variables or other intermediate information while processor 710 is executing instructions. In the illustrated embodiment, chipset 720 connects with processor 710 via Point-to-Point (PtP or P-P) interfaces 717 and 722. Chipset 720 enables processor 710 to connect to other elements in system 700. In some embodiments of the invention, interfaces 717 and 722 operate in accordance with a PtP communication protocol such as the Intel® QuickPath Interconnect (QPI) or the like. In other embodiments, a different interconnect may be used.

In some embodiments, chipset 720 is operable to communicate with processor 710, 705N, display device 740, and other devices 772, 776, 774, 760, 762, 764, 766, 777, etc. Chipset 720 may also be coupled to a wireless antenna 778 to communicate with any device configured to transmit and/or receive wireless signals.

Chipset 720 connects to display device 740 via interface 726. Display 740 may be, for example, a liquid crystal display (LCD), a plasma display, cathode ray tube (CRT) display, or any other form of visual display device. In some embodiments of the invention, processor 710 and chipset 720 are merged into a single SOC. In addition, chipset 720 connects to one or more buses 750 and 755 that interconnect various elements 774, 760, 762, 764, and 766. Buses 750 and 755 may be interconnected together via a bus bridge 772. In one embodiment, chipset 720 couples with a non-volatile memory 760, a mass storage device(s) 762, a keyboard/mouse 764, a network interface 766, a smart TV 776, consumer electronic(s) 777, etc. via interface 724.

In one embodiment, mass storage device 762 includes, but is not limited to, a solid state drive, a hard disk drive, a universal serial bus flash memory drive, or any other form of computer data storage medium. In one embodiment, network interface 766 is implemented by any type of well known network interface standard including, but not limited to, an Ethernet interface, a universal serial bus (USB) interface, a Peripheral Component Interconnect (PCI) Express interface, a wireless interface and/or any other suitable type of interface. In one embodiment, the wireless interface operates in accordance with, but is not limited to, the IEEE 802.11 standard and its related family, Home Plug AV (HPAV), Ultra Wide Band (UWB), Bluetooth, WiMax, or any form of wireless communication protocol.

While the modules shown in FIG. 7 are depicted as separate blocks within the system 700, the functions performed by some of these blocks may be integrated within a single semiconductor circuit or may be implemented using two or more separate integrated circuits. For example, although cache memory 716 is depicted as a separate block within processor 710, cache memory 716 (or selected aspects of 716) can be incorporated into processor core 712.

To better illustrate the methods and apparatuses described herein, a non-limiting set of example embodiments are set forth below as numerically identified examples:

Example 1 is an interconnect for a microelectronic device, including: a first group of multiple conductors extending in spaced relation to one another, with each conductor having contact surfaces on opposing ends; a second group of multiple conductors interleaved between the conductors of the first group of multiple conductors, the conductors of the second group of multiple conductors electrically coupled with one another; and a dielectric structure electrically isolating the conductors of the first group from the conductors of the second group, and retaining the first and second groups of multiple conductors in their respective orientations.

In Example 2, the subject matter of Example 1 optionally includes a shield extending along a first side of the first group of multiple conductors, where at least a portion of the conductors of the second group of multiple conductors are electrically coupled to one another and to the shield.

In Example 3, the subject matter of Example 2 where at least some conductors of the second group of multiple conductors extend to the shield along at least a portion of their length.

In Example 4, the subject matter of any one or more of Examples 2-3 where the dielectric structure optionally includes: a first dielectric layer extending over an outer surface of the shield; and a second dielectric layer extending between the interleaved conductors of the first and second groups of multiple conductors.

In Example 5, the subject matter of Example 4 where the shield and the second group of multiple conductors form a structure having a comb-like cross-section.

In Example 6, the subject matter of any one or more of Examples 4-5 where the second dielectric layer insulates the conductors of the first group of multiple conductors from the conductors of the second group of multiple conductors and from the shield.

In Example 7, the subject matter of any one or more of Examples 4-6 where the first and second dielectric layers are formed of the same dielectric material.

In Example 8, the subject matter of any one or more of Examples 4-7 where the first and second dielectric layers are formed of different dielectric materials.

In Example 9, the subject matter of any one or more of Examples 4-8 optionally include a first shielding contact surface in electrical communication with at least one of a conductor of the second group of multiple conductors and the shield proximate a first end of the interconnect; and a second shielding contact surface in electrical communication with at least one of a conductor of the second group of multiple conductors and the shield proximate a second end of the interconnect.

In Example 10, the subject matter of any one or more of Examples 1-9 where a first portion of the contact surfaces on a first end of the conductors of the first group of multiple conductors are arranged in linearly spaced relation proximate a first end of the interconnect, and where a second portion of the contact surfaces on a second end of the conductors of the first group of multiple conductors are arranged in linearly spaced relation proximate a second end of the interconnect.

In Example 11, the subject matter of Example 10 where the first and second portions of the contact surfaces proximate the first and second ends of the interconnect are each arranged at a common spacing distance to one another.

In Example 12, the subject matter of any one or more of Examples 10-11 where the contact surfaces on at least one end of the interconnect are configured to be coupled to respective contacts on a semiconductor die.

In Example 13, the subject matter of any one or more of Examples 1-12 where the conductors of the first group of multiple conductors extend generally parallel to one another; and where the conductors of the second group of multiple conductors extend generally parallel to one another.

Example 14 is a microelectronic device, including: a support structure having a first group of contacts; a first semiconductor die extending over at least a portion of the support structure, the first semiconductor die having a second group of contacts on a surface facing away from the support structure; and a first multi-conductor interconnect, including, a first group of multiple conductors extending in spaced relation to one another, with each conductor having first and second contact surfaces on first and second ends, the first contact surfaces coupled to respective contacts of the first group of contacts on the support structure, and the second contact surfaces coupled to respective contacts of the second group of contacts on the first semiconductor die, a second group of multiple conductors extending in spaced relation to the conductors of the first group, and interleaved between the conductors of the first group, and a dielectric structure electrically isolating the conductors of the first group from the conductors of the second group and retaining the conductors of the first and second groups in the interleaved orientations.

In Example 15, the subject matter of Example 14 where the support structure optionally includes a second semiconductor die.

In Example 16, the subject matter of Example 14 where the support structure optionally includes a substrate.

In Example 17, the subject matter of Example 14 where the support structure optionally includes a redistribution layer.

In Example 18, the subject matter of Example 14 where the multi-conductor interconnect further optionally includes a shield structure.

In Example 19, the subject matter of Example 18 where the shield structure is coupled to conductors of the second group of conductors.

In Example 20, the subject matter of Example 14 optionally including at least 50 conductors in the first group of conductors.

In Example 21, the subject matter of Example 14 optionally including at least 100 conductors in the first group of conductors.

In Example 22, the subject matter of Example 14 optionally including at least 200 conductors in the first group of conductors.

In Example 23, the subject matter of Example 14 where the dielectric structure of the multi-conductor interconnect optionally includes dielectric material formed around the first and second set of conductors.

In Example 24, the subject matter of Example 23 where the multi-conductor interconnect structure further optionally includes a shield structure, and where the dielectric structure further optionally includes dielectric material formed over the shield structure.

In Example 25, the subject matter of Example 14 where the dielectric structure is flexible.

In Example 26, the subject matter of Example 14 where the multi-conductor interconnect is flexible and is flexed to extend between the first group of contacts on the support structure and the second of contacts on the first semiconductor die.

In Example 27, the subject matter of Example 14 where the multiple conductors of the first group of multiple conductors alternate with the conductors of the second group of multiple conductors.

In Example 28, the subject matter of any one or more of Examples 14-27 where the support structure further optionally includes a third group of contacts; where the first semiconductor die optionally includes a fourth group of contacts on a surface facing away from the support structure; and further including a second multi-conductor interconnect, the second multi-conductor interconnect including, a respective first group of multiple conductors extending in spaced generally relation to one another, with each conductor having first and second contact surfaces on opposing ends, the first contact surfaces coupled to respective contacts of the third group of contacts on the support structure, and the second contact surfaces coupled to respective contacts of the fourth group of contacts on the first semiconductor die, a respective second group of multiple conductors extending in spaced relation to the conductors of the first group of multiple conductors of the second interconnect, and interleaved between the conductors of such first group, and a respective dielectric structure electrically isolating the conductors of the first group of multiple conductors of the second interconnect from the conductors of the second group of multiple conductors of the second interconnect, and retaining such conductors in the described orientations.

In Example 29, the subject matter of Example 28 where the second multi-conductor interconnect is flexible.

In Example 30, the subject matter of Example 28 where at least a portion of each of the first and third groups of contacts on the support structure extend in parallel to one another; where at least a portion of each of the second and fourth groups of contacts on the semiconductor die extend generally parallel to one another; and where the second multi-conductor interconnect extends above the first multi-conductor interconnect.

In Example 31, the subject matter of Example 28 where at least a portion of each of the first and third groups of contacts on the support structure extend generally linearly along lines generally perpendicular to one another; where at least a portion of each of the second and fourth groups of contacts on the semiconductor die extend generally linearly along different sides of the semiconductor die; and where the second multi-conductor interconnect extends generally perpendicularly to the first multi-conductor interconnect.

In Example 32, the subject matter of any one or more of Examples 14-27 optionally include where the support structure further optionally includes a third group of contacts, and further including: a second semiconductor die stacked over the first semiconductor die and including a fourth group of contacts on a surface facing away from the support structure; and a second multi-conductor interconnect, the second multi-conductor interconnect including, a respective first group of multiple conductors extending in spaced generally relation to one another, with each conductor having first and second contact surfaces on opposing ends, the first contact surfaces coupled to respective contacts of the third group of contacts on the support structure, and the second contact surfaces coupled to respective contacts of the fourth group of contacts on the second semiconductor die, a respective second group of multiple conductors extending in spaced relation to the conductors of the first group of multiple conductors of the second interconnect, and interleaved between the conductors of such first group, and a respective dielectric structure electrically isolating the conductors of the first group of multiple conductors of the second interconnect from the conductors of the second group of multiple conductors of the second interconnect, and retaining such conductors in the described orientations.

In Example 33, the subject matter of Example 32 where the second semiconductor die is stacked with a first side of the second semiconductor die proximate the fourth group of contacts essentially aligned with a first side of the underlying first semiconductor die proximate the second group of contacts, and where the first multi-conductor interconnect couples to 2s the second group of contacts at a location vertically between the first and second semiconductor die.

In Example 34, the subject matter of Example 32 optionally includes an adhesive layer mechanically coupling the second semiconductor die to the underlying first semiconductor die at a first vertical separation distance; and where the first multi-conductor interconnect is coupled to the second group of contacts within the first vertical separation distance.

In Example 35, the subject matter of any one or more of Examples 14-27 where the first semiconductor die is a processor.

In Example 36, the subject matter of any one or more of Examples 14-27 where the first semiconductor die is a memory device.

In Example 37, the subject matter of any one or more of Examples 14-27 where the first semiconductor die is one of: a processor, a chipset, a memory device, and a graphics processor.

In Example 38, the subject matter of any one or more of Examples 14-27 where the support structure optionally includes one or more of a processor, a chipset, a memory device, field programmable grid array, and a graphics processor.

Example 39 is a method of making an interconnect for a microelectronic device package, including: forming multiple conductors extending in spaced relation with one another on a surface; forming a dielectric material over the multiple conductors electrically isolating the multiple conductors from one another; forming an electrical connection between selected spaced conductors of the multiple conductors.

In Example 40, the subject matter of Example 39 where forming the multiple conductors optionally includes forming the multiple conductors to extend generally parallel to one another.

In Example 41, the subject matter of Example 39 optionally includes forming a shield layer extending above the multiple conductors, where the shield layer forms an electrical connection between selected spaced conductors of the multiple conductors.

In Example 42, the subject matter of Example 39 optionally include where forming the multiple conductors optionally includes forming a first group of conductors having contact surfaces on each end.

In Example 43, the subject matter of Example 39 where forming an electrical connection between selected spaced conductors of the multiple conductors optionally includes forming the electrical connection between conductors of a second group of conductors separate from the first group of conductors.

In Example 44, the subject matter of Example 39 where forming an electrical connection between selected spaced conductors of the multiple conductors optionally includes forming the electrical connection between a second group of conductors interleaved with the first group of conductors.

In Example 45, the subject matter of Example 44 where conductors of the second group of multiple conductors alternate with the conductors of the first group of multiple conductors.

In Example 46, the subject matter of Example 39 where forming the dielectric layer optionally includes forming openings to the selected spaced conductors of the multiple conductors; and where forming an electrical connection between the selected spaced multiple conductors optionally includes forming a shield layer which extends through the openings to the selected spaced conductors.

In Example 47, the subject matter of Example 46 where forming the shield layer optionally includes electroplating a metal material to form the shield layer.

In Example 48, the subject matter of Example 46 optionally includes forming a dielectric layer over at least a portion of the shield layer.

In Example 49, the subject matter of Example 46 where the openings are formed by laser drilling.

In Example 50, the subject matter of any one or more of Examples 39-49 where forming the multiple conductors on the surface optionally includes patterning a metal foil layer supported by a carrier.

In Example 51, the subject matter of Example 50 where patterning the metal foil layer optionally includes using a metal routing process.

In Example 52, the subject matter of Example 50 where patterning the metal foil layer optionally includes photolithography and etching of the metal foil layer.

In Example 53, the subject matter of any one or more of Examples 39-44 where forming multiple conductors extending in spaced relation with one another on a surface optionally includes arranging wires in spaced relation with one another on the surface.

In Example 54, the subject matter of any one or more of Examples 39-49 where the dielectric material is flexible.

Example 55 is a method of forming a microelectronic device, including: attaching a first semiconductor die to a support structure having a first group of contacts, the first semiconductor die extending over at least a portion of the support structure, the first semiconductor die having a second group of contacts on a surface facing away from the support structure; electrically coupling contacts of the first group of contacts on the support structure to respective contacts of the second group of contacts on the first semiconductor die through a multi-conductor interconnect, including, a first group of multiple conductors extending in spaced relation to one another, with each conductor having contact surfaces at first and second ends, a second group of multiple conductors interleaved between the conductors of the first group of multiple conductors, the conductors of the second group of multiple conductors electrically coupled with one another, and a dielectric structure extending between the conductors of the first and second groups and retaining the first and second groups of multiple conductors in their respective orientations, the electrically coupling further including, coupling the first contact surfaces to respective contacts of the first group of contacts on the support structure, and coupling the second contact surfaces to respective contacts of the second group of contacts on the first semiconductor die, and establishing an electrical connection between a first reference voltage node on the first semiconductor die and a second reference voltage node on the support structure through at least some portion of the second group of multiple conductors.

In Example 56, the subject matter of Example 55 where establishing the electrical connection between the first reference voltage node and a second voltage reference node, optionally includes: establishing a first electrical connection between the first reference voltage node on the first semiconductor die and a first conductor of the second group of multiple conductors; and establishing a second electrical connection between the second reference voltage node on the support structure and a second conductor of the second group of multiple conductors.

In Example 57, the subject matter of Example 55 where the support structure optionally includes a second semiconductor die.

In Example 58, the subject matter of Example 55 where the support structure optionally includes a substrate.

In Example 59, the subject matter of Example 55 where the support structure optionally includes a redistribution layer.

In Example 60, the subject matter of Example 55 where the multi-conductor interconnect further optionally includes a shield structure.

In Example 61, the subject matter of Example 60 where the shield structure is coupled to conductors of the second group of conductors.

In Example 62, the subject matter of Example 55 optionally including at least 50 conductors in the first group of conductors.

In Example 63, the subject matter of Example 55 optionally including at least 100 conductors in the first group of conductors.

In Example 64, the subject matter of Example 55 optionally including at least 200 conductors in the first group of conductors.

In Example 65, the subject matter of Example 64 where the dielectric structure of the multi-conductor interconnect extends around the first and second set of conductors.

In Example 66, the subject matter of Example 65 where the multi-conductor interconnect structure further optionally includes a shield structure, and where the dielectric structure further extends around the shield structure.

In Example 67, the subject matter of any one or more of Examples 55-66: where the support structure further optionally includes a third group of contacts; where the first semiconductor die optionally includes a fourth group of contacts on a surface facing away from the support structure; and further including electrically coupling respective contacts of the third group of contacts to respective contacts of the fourth group of contacts.

In Example 68, the subject matter of Example 67 where electrically coupling respective contacts of the third group of contacts to respective contacts of the fourth group of contacts, optionally includes coupling the respective contacts through use of a second multi-conductor interconnect, including: a respective first group of multiple conductors extending in spaced relation to one another, with each conductor having contact surfaces on opposing ends, a respective second group of multiple conductors interleaved between the conductors of the respective first group of multiple conductors, the conductors of the respective second group of multiple conductors electrically coupled with one another, and a dielectric structure extending over and between the conductors of the first and second groups and retaining the first and second groups of multiple conductors in their respective orientations, the electrically coupling further including, coupling the first contact surfaces to respective contacts of the third group of contacts on the support structure, and coupling the second contact surfaces to respective contacts of the fourth group of contacts on the first semiconductor die, establishing at least one electrical connection between a reference voltage node on the first semiconductor die and the second group of multiple conductors of the second multi-conductor interconnect, and establishing at least one electrical connection between a reference voltage node on the support structure and the second group of multiple conductors of the second multi-conductor interconnect.

In Example 69, the subject matter of Example 68: where at least a portion of each of the first and third groups of contacts on the support structure extend in parallel to one another; where at least a portion of each of the second and fourth groups of contacts on the semiconductor die extend generally parallel to one another; and where the second multi-conductor interconnect extends above the first multi-conductor interconnect.

In Example 70, the subject matter of Example 68 where at least a portion of each of the first and third groups of contacts on the support structure extend generally linearly along lines generally perpendicular to one another; where at least a portion of each of the second and fourth groups of contacts on the semiconductor die extend generally linearly along different sides of the semiconductor die; and where the second multi-conductor interconnect extends generally perpendicularly to the first multi-conductor interconnect.

In Example 71, the subject matter of any one or more of Examples 55-66 where the support structure further optionally includes a third group of contacts, and further including: attaching a second semiconductor die over the first semiconductor die, the second semiconductor die including a fourth group of contacts on a surface facing away from the support structure; and electrically connecting contacts of the third group of contacts to the fourth group of contacts through use of a second multi-conductor interconnect, the second multi-conductor interconnect including, a respective first group of multiple conductors extending in spaced generally relation to one another, with each conductor having first and second contact surfaces on opposing ends, the first contact surfaces coupled to respective contacts of the third group of contacts on the support structure, and the second contact surfaces coupled to respective contacts of the fourth group of contacts on the second semiconductor die, a respective second group of multiple conductors extending in spaced relation to the conductors of the first group of multiple conductors of the second interconnect, and interleaved between the conductors of such first group, and a respective dielectric structure electrically isolating the conductors of the first group of multiple conductors of the second interconnect from the conductors of the second group of multiple conductors of the second interconnect, and retaining such conductors in the described orientations.

In Example 72, the subject matter of Example 71: where attaching the second semiconductor die optionally includes placing the second semiconductor die with a first side of the second semiconductor die essentially aligned with a first side of the underlying first semiconductor die proximate the second group of contacts, and where electrically connecting contacts of the third group of contacts to the fourth group of contacts optionally includes coupling the first multi-conductor interconnect to the second group of contacts at a location vertically between the first and second semiconductor die.

In Example 73, the subject matter of Example 72 where attaching a second semiconductor die over the first semiconductor die optionally includes mechanically coupling the second semiconductor die to the underlying first semiconductor die at a first vertical separation distance through use of an adhesive material layer; and where the first multi-conductor interconnect is coupled to the second group of contacts within the first vertical separation distance.

In Example 74, the subject matter of any one or more of Examples 55-66 where electrically coupling contacts of the first group of contacts on the support structure to respective contacts of the second group of contacts on the first semiconductor die optionally includes attaching respective contact surfaces of the interconnect to respective contacts of the first and second groups of contacts, through use of one or more of: a thermal compression bonding process, a solder diffusion process, a solder reflow process, a surface activated bonding process.

Example 75 is an electronic system, including: a microelectronic device, including, a support structure having a first group of contacts; a first semiconductor die coupled to the support structure, the first semiconductor die having a second group of contacts on a surface facing away from the support structure; and a first multi-conductor interconnect, including, a first group of multiple conductors extending in spaced generally relation to one another, with each conductor having first and second contact surfaces on first and second ends, the first contact surfaces coupled to respective contacts of the first group of contacts on the support structure, and the second contact surfaces coupled to respective contacts of the second group of contacts on the first semiconductor die, a second group of multiple conductors extending in spaced relation to the conductors of the first group, and interleaved between the conductors of the first group, and a dielectric structure electrically isolating the conductors of the first group from the conductors of the second group.

In Example 76, the subject matter of Example 75 where the first semiconductor die is a processor.

In Example 77, the subject matter of Example 75 where the first semiconductor die is a memory device.

In Example 78, the subject matter of Example 75 optionally include where the first semiconductor die is one of: a processor, a chipset, a memory device, field programmable grid array, and a graphics processor.

In Example 79, the subject matter of Example 75 where support structure optionally includes one or more of a processor, a chipset, a memory device, field programmable grid array, and a graphics processor.

In Example 80, the subject matter of Example 75 optionally includes at least one of a mass storage device and a network interface operably coupled to the microelectronic device.

In Example 81, the subject matter of Example 75 where the support structure optionally includes a second semiconductor die.

In Example 82, the subject matter of Example 75 where the support structure optionally includes a substrate.

In Example 83, the subject matter of Example 75 where the support structure optionally includes a redistribution layer.

In Example 84, the subject matter of Example 75 where the multi-conductor interconnect further optionally includes a shield structure.

In Example 85, the subject matter of Example 84 where the shield structure is coupled to conductors of the second group of conductors.

In Example 86, the subject matter of any one or more of Examples 75-85 where the support structure further optionally includes a third group of contacts, and further including: a second semiconductor die stacked over the first semiconductor die and including a fourth group of contacts on a surface facing away from the support structure; and a second multi-conductor interconnect, the second multi-conductor interconnect including, a respective first group of multiple conductors extending in spaced generally relation to one another, with each conductor having first and second contact surfaces on opposing ends, the first contact surfaces coupled to respective contacts of the third group of contacts on the support structure, and the second contact surfaces coupled to respective contacts of the fourth group of contacts on the second semiconductor die, a respective second group of multiple conductors extending in spaced relation to the conductors of the first group of multiple conductors of the second interconnect, and interleaved between the conductors of such first group, and a respective dielectric structure electrically isolating the conductors of the first group of multiple conductors of the second interconnect from the conductors of the second group of multiple conductors of the second interconnect, and retaining such conductors in the described orientations.

In Example 87, the subject matter of any one or more of Examples 75-85 where the support structure further optionally includes a third group of contacts; where the first semiconductor die optionally includes a fourth group of contacts on a surface facing away from the support structure; and further including a second multi-conductor interconnect, the second multi-conductor interconnect including, a respective first group of multiple conductors extending in spaced generally relation to one another, with each conductor having first and second contact surfaces on opposing ends, the first contact surfaces coupled to respective contacts of the third group of contacts on the support structure, and the second contact surfaces coupled to respective contacts of the fourth group of contacts on the first semiconductor die, a respective second group of multiple conductors extending in spaced relation to the conductors of the first group of multiple conductors of the second interconnect, and interleaved between the conductors of such first group, and a respective dielectric structure electrically isolating the conductors of the first group of multiple conductors of the second interconnect from the conductors of the second group of multiple conductors of the second interconnect, and retaining such conductors in the described orientations.

In Example 88, the subject matter of Example 87 where at least a portion of each of the first and third groups of contacts on the support structure extend in parallel to one another; where at least a portion of each of the second and fourth groups of contacts on the semiconductor die extend generally parallel to one another; and where the second multi-conductor interconnect extends above the first multi-conductor interconnect.

In Example 89, the subject matter of Example 87 where at least a portion of each of the first and third groups of contacts on the support structure extend generally linearly along lines generally perpendicular to one another; where at least a portion of each of the second and fourth groups of contacts on the semiconductor die extend generally linearly along different sides of the semiconductor die; and where the second multi-conductor interconnect extends generally perpendicularly to the first multi-conductor interconnect.

In example 90, the subject matter of example 87, including a microelectronic device including any of the structures identified in one or more of Examples 1-38.

In example 91, the subject matter of example 87, including a microelectronic device manufactured in accordance with any of the methods set forth in Examples 55-72.

In example 92, the subject matter of example 87, including an interconnect manufactured in accordance with any the of the methods of Examples 39-54.

In example 93, a microelectronic device having a structure in accordance with any one or more of Examples 1-54.

In example 94, the microelectronic device of Example 93 including any one or more components manufactured in accordance with any one or more of Examples 39-54.

The above detailed description includes references to the accompanying drawings, which form a part of the detailed description. The drawings show, by way of illustration, specific embodiments in which the invention can be practiced. These embodiments are also referred to herein as "examples." Such examples can include elements in addition to those shown or described. However, the present inventors also contemplate examples in which only those elements shown or described are provided. Moreover, the present inventors also contemplate examples using any combination or permutation of those elements shown or described (or one or more aspects thereof), either with respect to a particular example (or one or more aspects thereof), or with respect to other examples (or one or more aspects thereof) shown or described herein.

In this document, the terms "a" or "an" are used, as is common in patent documents, to include one or more than one, independent of any other instances or usages of "at least one" or "one or more." In this document, the term "or" is used to refer to a nonexclusive or, such that "A or B" includes "A but not B," "B but not A," and "A and B," unless otherwise indicated. In this document, the terms "including" and "in which" are used as the plain-English equivalents of the respective terms "comprising" and "wherein." Also, in the following claims, the terms "including" and "comprising" are open-ended, that is, a system, device, article, composition, formulation, or process that includes elements in addition to those listed after such a term in a claim are still deemed to fall within the scope of that claim. Moreover, in the following claims, the terms "first," "second," and "third," etc. are used merely as labels, and are not intended to impose numerical requirements on their objects.

The above description is intended to be illustrative, and not restrictive. For example, the above-described examples (or one or more aspects thereof) may be used in combination with each other. Other embodiments can be used, such as by one of ordinary skill in the art upon reviewing the above description. The Abstract is provided to comply with 37 C.F.R. § 1.72(b), to allow the reader to quickly ascertain the nature of the technical disclosure. It is submitted with the understanding that it will not be used to interpret or limit the scope or meaning of the claims. Also, in the above Detailed Description, various features may be grouped together to streamline the disclosure. This should not be interpreted as intending that an unclaimed disclosed feature is essential to any claim. Rather, inventive subject matter may lie in less than all features of a particular disclosed embodiment. Thus, the following claims are hereby incorporated into the Detailed Description, with each claim standing on its own as a separate embodiment, and it is contemplated that such embodiments can be combined with each other in various combinations or permutations. The scope of the invention should be determined with reference to the appended claims, along with the full scope of equivalents to which such claims are entitled.

The invention claimed is:

1. An interconnect for a microelectronic device, comprising:
   a first group of multiple conductors extending in spaced relation to one another, with each conductor having contact surfaces on opposing ends;
   a second group of multiple conductors interleaved between the conductors of the first group of multiple conductors, the conductors of the second group of multiple conductors electrically coupled with one another and electrically isolated from conductors of the first group of multiple conductors; and
   a dielectric structure electrically isolating the conductors of the first group from the conductors of the second group, and retaining the first and second groups of multiple conductors in their respective orientations;
   wherein the first and second groups of multiple conductors and the dielectric structure form a flexible interconnect capable of being deformed.

2. The interconnect of claim 1:
   wherein the conductors of the first group of multiple conductors extend generally parallel to one another; and
   wherein the conductors of the second group of multiple conductors extend generally parallel to one another.

3. An interconnect for a microelectronic device, comprising:
   a first group of multiple conductors extending in spaced relation to one another, with each conductor having contact surfaces on opposing ends;
   a second group of multiple conductors interleaved between the conductors of the first group of multiple conductors, the conductors of the second group of multiple conductors electrically coupled with one another;
a dielectric structure electrically isolating the conductors of the first group from the conductors of the second group, and retaining the first and second groups of multiple conductors in their respective orientations; and
a shield extending along a first side of the first group of multiple conductors, wherein at least a portion of the conductors of the second group of multiple conductors are electrically coupled to one another and to the shield;
wherein the dielectric structure comprises:
a first dielectric layer extending over an outer surface of the shield; and
a second dielectric layer extending between the interleaved conductors of the first and second groups of multiple conductors.

4. The interconnect of claim 3, wherein at least some conductors of the second group of multiple conductors extend to the shield along at least a portion of their length.

5. The interconnect of claim 3, further comprising:
a first shielding contact surface in electrical communication with at least one of a conductor of the second group of multiple conductors and the shield proximate a first end of the interconnect; and
a second shielding contact surface in electrical communication with at least one of a conductor of the second group of multiple conductors and the shield proximate a second end of the interconnect.

6. A microelectronic device, comprising:
a support structure having a first group of contacts;
a first semiconductor die extending over at least a portion of the support structure, the first semiconductor die having a second group of contacts on a surface facing away from the support structure; and
a first multi-conductor flexible interconnect capable of being deformed sufficiently to engage the first and second groups of contacts, including,
a first group of multiple conductors extending in spaced relation to one another, with each conductor having first and second contact surfaces on first and second ends, the first contact surfaces coupled to respective contacts of the first group of contacts on the support structure, and the second contact surfaces coupled to respective contacts of the second group of contacts on the first semiconductor die,
a second group of multiple conductors extending in spaced relation to the conductors of the first group, and interleaved between the conductors of the first group, and
a dielectric structure electrically isolating the conductors of the first group from the conductors of the second group and retaining the conductors of the first and second groups in the interleaved orientations.

7. The microelectronic device of claim 6, wherein the support structure comprises a second semiconductor die.

8. The microelectronic device of claim 6, wherein the support structure comprises a substrate.

9. The microelectronic device of claim 6, wherein the dielectric structure of the multi-conductor interconnect comprises dielectric material formed around the first and second set of conductors.

10. The microelectronic device of claim 6, wherein the support structure further comprises a third group of contacts, and further comprising:

a second semiconductor die stacked over the first semiconductor die and including a fourth group of contacts on a surface facing away from the support structure; and
a second multi-conductor interconnect, the second multi-conductor interconnect comprising,
a respective first group of multiple conductors extending in spaced generally relation to one another, with each conductor having first and second contact surfaces on opposing ends, the first contact surfaces coupled to respective contacts of the third group of contacts on the support structure, and the second contact surfaces coupled to respective contacts of the fourth group of contacts on the second semiconductor die,
a respective second group of multiple conductors extending in spaced relation to the conductors of the first group of multiple conductors of the second interconnect, and interleaved between the conductors of such first group, and
a respective dielectric structure electrically isolating the conductors of the first group of multiple conductors of the second interconnect from the conductors of the second group of multiple conductors of the second interconnect, and retaining such conductors in the described orientations.

11. A microelectronic device, comprising:
a support structure having a first group of contacts;
a first semiconductor die extending over at least a portion of the support structure, the first semiconductor die having a second group of contacts on a surface facing away from the support structure; and
a first multi-conductor interconnect, including,
a first group of multiple conductors extending in spaced relation to one another, with each conductor having first and second contact surfaces on first and second ends, the first contact surfaces coupled to respective contacts of the first group of contacts on the support structure, and the second contact surfaces coupled to respective contacts of the second group of contacts on the first semiconductor die,
a second group of multiple conductors extending in spaced relation to the conductors of the first group, and interleaved between the conductors of the first group, and
a dielectric structure electrically isolating the conductors of the first group from the conductors of the second group and retaining the conductors of the first and second groups in the interleaved orientations;
wherein the multi-conductor interconnect structure further comprises a shield structure, and wherein the dielectric structure further comprises dielectric material formed over the shield structure.

12. The microelectronic device of claim 11, wherein the dielectric structure is flexible.

13. A microelectronic device, comprising:
a support structure having a first group of contacts;
a first semiconductor die extending over at least a portion of the support structure, the first semiconductor die having a second group of contacts on a surface facing away from the support structure;
a first multi-conductor interconnect, including,
a first group of multiple conductors extending in spaced relation to one another, with each conductor having first and second contact surfaces on first and second ends, the first contact surfaces coupled to respective contacts of the first group of contacts on the support structure, and the second contact surfaces coupled to respective contacts of the second group of contacts on the first semiconductor die,
a second group of multiple conductors extending in spaced relation to the conductors of the first group, and interleaved between the conductors of the first group, and
a dielectric structure electrically isolating the conductors of the first group from the conductors of the second group and retaining the conductors of the first and second groups in the interleaved orientations;
wherein the support structure further comprises a third group of contacts;
wherein the first semiconductor die further comprises a fourth group of contacts on a surface facing away from the support structure; and
further comprising a second multi-conductor interconnect, the second multi-conductor interconnect comprising,
a respective first group of multiple conductors extending in spaced generally relation to one another, with each conductor having first and second contact surfaces on opposing ends, the first contact surfaces coupled to respective contacts of the third group of contacts on the support structure, and the second contact surfaces coupled to respective contacts of the fourth group of contacts on the first semiconductor die,
a respective second group of multiple conductors extending in spaced relation to the conductors of the first group of multiple conductors of the second interconnect, and interleaved between the conductors of such first group, and
a respective dielectric structure electrically isolating the conductors of the first group of multiple conductors of the second interconnect from the conductors of the second group of multiple conductors of the second interconnect, and retaining such conductors in the described orientations.

14. The microelectronic device of claim 13,
wherein at least a portion of each of the first and third groups of contacts on the support structure extend in parallel to one another;
wherein at least a portion of each of the second and fourth groups of contacts on the semiconductor die extend generally parallel to one another; and
wherein the second multi-conductor interconnect extends above the first multi-conductor interconnect.

15. The microelectronic device of claim 13,
wherein at least a portion of each of the first and third groups of contacts on the support structure extend generally linearly along lines generally perpendicular to one another;
wherein at least a portion of each of the second and fourth groups of contacts on the semiconductor die extend generally linearly along different sides of the semiconductor die; and
wherein the second multi-conductor interconnect extends generally perpendicularly to the first multi-conductor interconnect.

16. A method of making an interconnect for a microelectronic device package, comprising:
forming multiple conductors extending in spaced relation with one another on a surface;
forming a dielectric material over the multiple conductors electrically isolating the multiple conductors from one another;
forming an electrical connection between selected spaced conductors of the multiple conductors;
wherein forming the dielectric layer comprises forming openings to the selected spaced conductors of the multiple conductors; and
wherein forming an electrical connection between the selected spaced multiple conductors comprises forming a shield layer which extends through the openings to the selected spaced conductors.

17. The method of claim 16, wherein forming the multiple conductors comprises forming the multiple conductors to extend generally parallel to one another.

18. The method of claim 16, further comprising forming a shield layer extending above the multiple conductors, wherein the shield layer forms an electrical connection between selected spaced conductors of the multiple conductors.

19. The method of claim 16, wherein forming the multiple conductors comprises forming a first group of conductors having contact surfaces on each end.

20. The method of claim 16, wherein conductors of the selected spaced conductors alternate with the conductors of the first group of multiple conductors.

21. An electronic system, comprising:
a microelectronic device, comprising,
a support structure having a first group of contacts;
a first semiconductor die coupled to the support structure, the first semiconductor die having a second group of contacts on a surface facing away from the support structure; and
a first flexible multi-conductor interconnect, including,
a first group of multiple conductors extending in spaced generally relation to one another, with each conductor having first and second contact surfaces on first and second ends, the first contact surfaces coupled to respective contacts of the first group of contacts on the support structure, and the second contact surfaces coupled to respective contacts of the second group of contacts on the first semiconductor die,
a second group of multiple conductors extending in spaced relation to the conductors of the first group, and interleaved between the conductors of the first group, and
a dielectric structure electrically isolating the conductors of the first group from the conductors of the second group
wherein the flexible interconnect is capable of being deformed sufficiently to allow individual contact surfaces of the first and second contact surfaces of the flexible interconnect to engage respective contacts of the first and second groups of contacts.

22. The electronic system of claim 21, wherein the support structure further comprises a third group of contacts, and further comprising:
a second semiconductor die stacked over the first semiconductor die and including a fourth group of contacts on a surface facing away from the support structure; and
a second multi-conductor interconnect, the second multi-conductor interconnect comprising,
a respective first group of multiple conductors extending in spaced generally relation to one another, with each conductor having first and second contact surfaces on opposing ends, the first contact surfaces coupled to respective contacts of the third group of contacts on the support structure, and the second contact surfaces coupled to respective contacts of the fourth group of contacts on the second semiconductor die, a respective second group of multiple conductors extending in spaced relation to the conductors of the first group of multiple conductors of the second interconnect, and interleaved between the conductors of such first group, and a respective dielectric structure electrically isolating the conductors of the first group of multiple conductors of the second interconnect from the conductors of the second group of multiple conductors of the second interconnect, and retaining such conductors in the described orientations.

\* \* \* \* \*